(12) United States Patent
Yoshioka

(10) Patent No.: US 9,570,412 B2
(45) Date of Patent: Feb. 14, 2017

(54) SEMICONDUCTOR DEVICE

(71) Applicant: Panasonic Intellectual Property Management Co., Ltd., Osaka (JP)

(72) Inventor: Yoshimasa Yoshioka, Shiga (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/088,265

(22) Filed: Apr. 1, 2016

(65) Prior Publication Data

US 2016/0218073 A1 Jul. 28, 2016

Related U.S. Application Data

(63) Continuation of application No. PCT/JP2014/005771, filed on Nov. 18, 2014.

(30) Foreign Application Priority Data

Nov. 29, 2013 (JP) .................................. 2013-246946

(51) Int. Cl.
*H01L 23/04* (2006.01)
*H01L 23/52* (2006.01)
(Continued)

(52) U.S. Cl.
CPC ........... *H01L 24/05* (2013.01); *H01L 21/7682* (2013.01); *H01L 23/3192* (2013.01); *H01L 24/13* (2013.01);
(Continued)

(58) Field of Classification Search
CPC ............. H01L 29/0684; H01L 29/4958; H01L 29/4966; H01L 29/51; H01L 29/515; H01L 24/15; H01L 24/16; H01L 24/23; H01L 24/31; H01L 24/68; H01L 24/69; H01L 27/28
(Continued)

(56) References Cited

U.S. PATENT DOCUMENTS

2002/0063262 A1 5/2002 Matsuzaki et al.
2003/0173674 A1 9/2003 Nakamura
(Continued)

FOREIGN PATENT DOCUMENTS

JP 6-097299 4/1994
JP 2002-170929 6/2002
(Continued)

OTHER PUBLICATIONS

International Search Report of PCT application No. PCT/JP2014/005771 dated Feb. 17, 2015.

*Primary Examiner* — Hsien Ming Lee
(74) *Attorney, Agent, or Firm* — McDermott Will & Emery LLP

(57) ABSTRACT

A semiconductor device includes a first metal wiring formed on a semiconductor substrate, a first organic insulating film formed on the first metal wiring, and a second metal wiring formed to cover the first organic insulating film and having a via connected to the first metal wiring. The semiconductor device further includes a second organic insulating film formed on the first organic insulating film and having an opening to expose the second metal wiring, a bump formed on an exposed portion of the second metal wiring in the opening, and a tunnel portion formed in contact with the second metal wiring or the first organic insulating film. The tunnel portion overlaps with the second metal wiring in planar view.

16 Claims, 20 Drawing Sheets

(51) Int. Cl.
*H01L 21/44* (2006.01)
*H01L 21/4763* (2006.01)
*H01L 23/00* (2006.01)
*H01L 21/768* (2006.01)
*H01L 23/31* (2006.01)
*H01L 23/525* (2006.01)

(52) U.S. Cl.
CPC .......... *H01L 23/3114* (2013.01); *H01L 23/525* (2013.01); *H01L 24/03* (2013.01); *H01L 2224/024* (2013.01); *H01L 2224/02123* (2013.01); *H01L 2224/02331* (2013.01); *H01L 2224/02335* (2013.01); *H01L 2224/0345* (2013.01); *H01L 2224/0346* (2013.01); *H01L 2224/0391* (2013.01); *H01L 2224/05011* (2013.01); *H01L 2224/05139* (2013.01); *H01L 2224/05144* (2013.01); *H01L 2224/05166* (2013.01); *H01L 2224/05548* (2013.01); *H01L 2224/05567* (2013.01); *H01L 2224/05582* (2013.01); *H01L 2224/05647* (2013.01); *H01L 2224/131* (2013.01); *H01L 2224/13014* (2013.01); *H01L 2224/13021* (2013.01); *H01L 2224/13024* (2013.01); *H01L 2924/35121* (2013.01)

(58) Field of Classification Search
USPC ....... 257/618, 622, 635, 638, 642, 643, 678, 257/698, 737, 759; 438/612–614, 619, 438/622, 637
See application file for complete search history.

(56) References Cited

U.S. PATENT DOCUMENTS

| | | |
|---|---|---|
| 2004/0188718 A1 | 9/2004 | Matsuzaki |
| 2005/0218432 A1 | 10/2005 | Matsuzaki et al. |
| 2007/0045860 A1 | 3/2007 | Nakamura |
| 2008/0142847 A1 | 6/2008 | Matsuzaki et al. |

FOREIGN PATENT DOCUMENTS

| | | |
|---|---|---|
| JP | 2003-273210 | 9/2003 |
| JP | 2004-207324 | 7/2004 |

SEMICONDUCTOR DEVICE

RELATED APPLICATIONS

This application is a Continuation of International Application No. PCT/JP2014/005771, filed on Nov. 18, 2014, which in turn claims priority from Japanese Patent Application No. 2013-246946, filed on Nov. 29, 2013, the contents of all of which are incorporated herein by reference in their entireties.

BACKGROUND

1. Field of the Invention

The present disclosure relates to a semiconductor device having a large metal wiring and an insulating layer made of organic material.

2. Description of the Relates Art

A dual inline package or a quad flat package, in which a semiconductor chip is sealed with resin, is used as conventional semiconductor package structures. In these semiconductor package structures, a metal lead wiring is mainly provided on a side of the resin package. Meanwhile, recently, a chip scale package (CSP) has quickly become widespread as a semiconductor package structure. This package employs a ball grid array (BGA) technique in which electrodes are planarly disposed on a flat surface of the package, so that an area of the package is almost the same as an area of the semiconductor chip. According to the chip scale package, a semiconductor chip can be densely mounted on an electronic circuit substrate in smaller area than conventional one while the semiconductor chip has the same number of electrode terminals and the same projected area as the conventional one.

The chip scale package is a packaging method including cutting a silicon wafer, on which circuits have been formed, into semiconductor chips, and then packaging the respective semiconductor chips individually.

Meanwhile, according to a method for manufacturing a wafer level CSP, an insulating layer, a rewiring layer, and a sealing layer are sequentially formed on a silicon wafer, and a solder bump is formed. Furthermore, in a final process, the wafer is cut into semiconductor chips each having a predetermined size, whereby the packaged chips are provided.

According to a conventional semiconductor device, a photo-sensitive organic film used as an insulating layer is made of polyimide or benzocyclobutene (BCB). In addition, a rewiring layer is made of copper (Cu) in many cases.

FIG. 17 is a cross-sectional view of an main part of the conventional semiconductor device. As shown in FIG. 17, according to the conventional semiconductor device, plurality of metal wirings 4 are formed on semiconductor substrate 1, and insulating film 2 is provided so as to cover metal wirings 4. Upper metal wiring 5 is provided on insulating film 2, and sealing resin 3 and solder bump 6 are formed on metal wiring 5.

According to the conventional semiconductor device, a difference in thermal stress is generated between insulating film 2, metal wirings 4 and 5, and semiconductor substrate 1, due to heat of a heat treatment, for example connecting solder bump 6, in a manufacturing process. A physical factor due to the thermal stress difference and mechanical outer force cause a connection defect between solder bump 6 and semiconductor substrate 1. This connection defect makes reliability of the semiconductor device decrease.

Thus, as shown in FIG. 18, in order to prevent metal wiring 11 from being peeled from insulating film 8 provided under metal wiring 11, wedge 13 is proposed to be provided in a lower portion of metal wiring 11 (refer to, for example, Unexamined Japanese Patent Publication No. 2004-207324). Thus, when wedge 13 provided in metal wiring 11 is inserted in insulating film 8, insulating film 8 and metal wiring 11 can be strongly adhered to each other, so that solder bump 12 and metal wiring 11 can be prevented from being peeled from each other due to the stress, which enhances the reliability of the semiconductor device.

As described above, solder bump 12 can improve its bump-shear strength and bump-pull strength, so that reliability with respect to the stress caused by a difference in thermal expansion coefficient can be improved in the semiconductor device.

SUMMARY

A semiconductor device in one aspect of the present disclosure includes: a semiconductor substrate; a first wiring formed on the semiconductor substrate; and a first organic insulating film formed to cover the first wiring. The semiconductor device further includes: a second wiring formed on the first organic insulating film and having a connection portion connected to the first wiring; a second organic insulating film formed on the first organic insulating film to cover the second wiring and having an opening to expose the second wiring; a bump formed on an exposed portion of the second wiring in the opening; and a tunnel portion formed in contact with the second wiring or the first organic insulating film. The tunnel portion overlaps with the second wiring in planar view.

According to the one aspect of the semiconductor device, gas generated from the organic insulating film in a manufacturing process of the semiconductor device is directly or indirectly discharged outside the semiconductor device through the tunnel portion. Thus, even in a region under the relatively large second wiring, a pressure due to the gas generated from the first organic insulating film does not become high in an interface between the first organic insulating film and the second wiring. Therefore, the second wiring or the bump can be prevented from being peeled from the first organic insulating film.

In one aspect, the tunnel portion may be a hollow portion or the hollow portion partially filled with an insulating film having a lower density than the first organic insulating film.

Thus, the gas generated from the first organic insulating film can be diffused through the hollow portion or through the insulating film having the lower density than the first organic insulating film. Furthermore, the gas is diffused from a periphery or outer portion of the second wiring to the second organic insulating film, and can be discharged outside the semiconductor device.

In one aspect, the tunnel portion may be configured from a plurality of line-shaped portions.

In one aspect, the tunnel portion may be provided in an upper portion of the first organic insulating film and disposed in contact with the second wiring.

In one aspect, one end of the tunnel portion may be disposed under the second wiring.

In this case, the other end of the tunnel portion may be disposed in a region outside the second wiring in planar view.

In this case, the semiconductor device may further include an upward tunnel portion formed in the second organic insulating film, the upward tunnel portion being connected to the other end of the tunnel portion, and extending upward from the tunnel portion.

Furthermore, in one aspect, the tunnel portion may be provided under the second wiring and disposed in contact with the first organic insulating film.

In this case, the tunnel portion may be provided in a lower portion of the first organic insulating film and a top edge of the tunnel portion may be covered with an inorganic insulating film.

Furthermore, in this case, one end of the tunnel portion may be provided so as to match with an end of the second wiring in planar view.

Furthermore, in this case, the tunnel portion may have both ends positioned inside the second wiring in planar view.

Furthermore, in this case, the tunnel portion may be configured from a recess provided in a lower portion of the second wiring.

In this case, the semiconductor device in one aspect further includes an upward tunnel portion penetrating the second wiring, the upward tunnel portion being connected to the tunnel portion, and extending upward from the tunnel portion.

In this case, the tunnel portion may be configured from a plurality of line-shaped portions disposed in parallel.

In one aspect, a width Wm of the second wiring may satisfy a formula below.

$$Wm > 2 \times (a_{metal}/a_{poly}) \times To$$

in which $a_{metal}$ represents specific gravity of a metal constituting the second wiring, $a_{poly}$ represents specific gravity of the first organic insulating film, and To represents a thickness of the first organic insulating film.

According to the semiconductor device in the present disclosure, the organic insulating film and the metal wiring is prevented from being peeled from each other due to the gas, so that the reliability of the semiconductor device can be improved.

DETAILED DESCRIPTION OF THE PREFERRED EMBODIMENTS

In order to improve reliability of a semiconductor device, it is important to highly bond an insulating film to a metal wiring, and the metal wiring to a solder bump. Especially, in a semiconductor device used for an in-vehicle device or for a high-voltage inverter, it is necessary to connect the solder bump to the metal wiring at a temperature higher than usual in order to highly bond the solder bump to the metal wiring. For example, a temperature exceeding 300° C. is applied to the semiconductor device in this process. Furthermore, the insulating film is a photo-sensitive organic film generally made of polyimide or BCB, so that a curing process needs to be performed at high temperature to chemically stabilize a film quality of the organic film.

Thus, in the case where the high-temperature process is needed in the process for manufacturing the semiconductor device, a gas of a solvent and a low-molecular-weight component remaining in the organic film comes out from the film. The gas generated from this film lifts the metal wiring, and causes a peeling problem. The wedge provided in the semiconductor device in Unexamined Japanese Patent Publication No. 2004-207324 is effective against the stress caused by the difference in thermal expansion coefficient, but not effective against the gas generated from the organic film because it confines the gas in the film.

The present disclosure provides a semiconductor device to prevent the metal wiring from being peeled from the organic insulating film due to the gas, whose reliability is improved.

The semiconductor device of the present disclosure and a method for manufacturing the same provides an organic insulating film or a metal wiring partially which has a structure to readily discharge the gas generated from the organic insulating film.

First Exemplary Embodiment

A semiconductor device having a tunnel portion in an interlayer insulating film and a method for manufacturing the same in the first exemplary embodiment will be described with reference to the drawings.

Figure 1A:
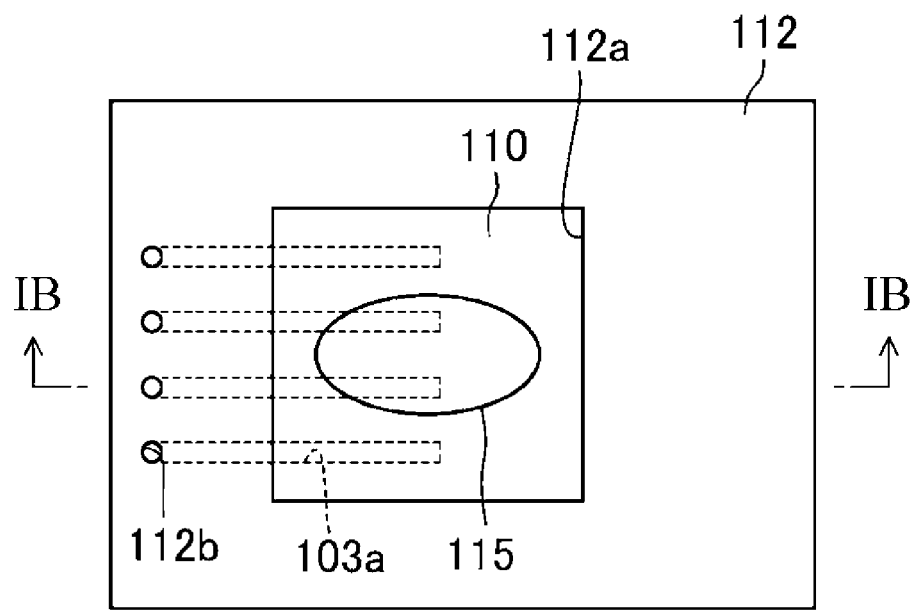
FIG. 1A is a plan view showing a main part of a semiconductor device in a first exemplary embodiment.
Figure 1B:
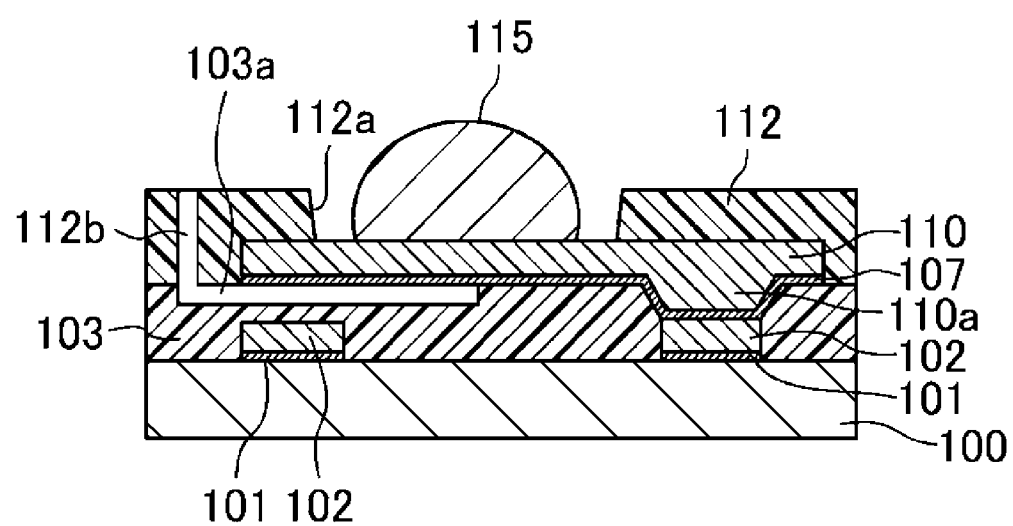
FIG. 1B is a cross-sectional view of the semiconductor device taken along line IB-IB in FIG. 1A.

FIGS. 1A and 1B each schematically show a main part of the semiconductor device in the first exemplary embodiment. FIG. 1A is a plan view of the semiconductor device, and FIG. 1B is a cross-sectional view of the semiconductor device taken along line IB-IB in FIG. 1A.

As shown in FIGS. 1A and 1B, in the semiconductor device in this exemplary embodiment, plurality of first metal wirings 102 are formed on semiconductor substrate 100 having a semiconductor element (not shown). First metal wiring 102 serves as a standard lead wiring for semiconductor substrate 100. First metal wiring 102 extends in a in a perpendicular direction to the plane of the drawing. First organic insulating film 103 is formed on semiconductor substrate 100 to cover first metal wirings 102. Second metal wiring 110 is formed on first organic insulating film 103 and connected to first metal wiring 102 through via 110a. Second metal wiring 110 having a relatively large area includes a pad electrode or the like. Second organic insulating film 112 having opening 112a to expose an upper surface of second metal wiring 110 is formed on first organic insulating film 103 and second metal wiring 110. Solder bump 115 is formed on an exposed portion of second metal wiring 110 in opening 112a. Furthermore, seed layers 101 and 107 made of material such as titanium (Ti) may be formed on lower surfaces of first metal wiring 102 and second metal wiring 110, respectively, in order to form the metal wirings by copper plating. Furthermore, as described above, second metal wiring 110 has a wide portion for the pad electrode, and is larger than first metal wiring 102.

In this exemplary embodiment, at least one tunnel portion 103a is formed in an upper portion of first organic insulating film 103 so as to be in contact with second metal wiring 110. Tunnel portion 103a is a hollow portion provided in contact with a lower surface of second metal wiring 110. Tunnel portion 103a is provided so that gas generated from first organic insulating film 103 under second metal wiring 110 can move to a peripheral region of second metal wiring 110. Therefore, tunnel portion 103a does not need to be the hollow portion. Tunnel portion 103a may be filled with a sparse film such as porous film having a lower density than first organic insulating film 103 if the gas is allowed to pass through tunnel portion 103a. The porous film having the lower density than first organic insulating film 103 may be a porous low-permittivity film or a fluorocarbon-based low-permittivity film or the like.

Tunnel portion 103a may be a plurality of line-shaped portions arranged in parallel. One end of tunnel portion 103a is positioned in a region under second metal wiring 110, and the other end of tunnel portion 103a is positioned outside the region under second metal wiring 110. Furthermore, the other end of tunnel portion 103a is connected to upward tunnel portion 112b extending upward in second organic insulating film 112, above semiconductor substrate 100. That is, tunnel portion 103a is connected to an outside of the semiconductor device through upward tunnel portion 112b. Therefore, the gas generated from first organic insulating film 103 during a heat treatment in a process is discharged outside the semiconductor device through tunnel portion 103a and upward tunnel portion 112b. Thus, at least one of plurality of tunnel portions 103a formed in first organic insulating film 103 is preferably provided under a center of second metal wiring 110.

Here, a formula (1) below may be satisfied where To represents a thickness of first organic insulating film 103 disposed under second metal wiring 110, $a_{poly}$ represents specific gravity of first organic insulating film 103, Wm represents a width of second metal wiring 110, and $a_{metal}$ represents specific gravity of a metal constituting second metal wiring 110.

$$2 \times (a_{metal}/a_{poly}) \times To < Wm \tag{1}$$

In a case where the formula (1) is satisfied, the metal wiring can be surely prevented from being peeled from the organic insulating film that is disposed thereunder by providing tunnel portion 103a and upward tunnel portion 112b.

In general, when the metal wiring is formed as a metal pattern which has the relatively large area serving as a pad region, the gas generated from the organic insulating film disposed under the metal wiring due to the heat treatment cannot be discharged outside because the metal is a dense material. Therefore, in a region right under the metal pattern having relatively large area, a pressure of a gas confined between the metal pattern and the organic insulating film becomes high, and as a result, peeling is generated between the metal wiring and the organic insulating film.

Thus, according to this exemplary embodiment, the tunnel portion is provided in the upper portion of the organic insulating film so as to be in contact with the lower surface of the metal wiring, so that the gas generated from the organic insulating film due to the heat treatment can be discharged outside. For example, a case is considered where the organic insulating film is made of polyimide and has a thickness of 10 μm, and the metal wiring is made of copper. Since specific gravity of polyimide is about 1.5 and specific gravity of copper is about 9, tunnel portion 103a to prevent the peeling of the metal wiring is to be provided when Wm is about 120 μm or more according to the above formula (1).

Manufacturing Method

Hereinafter, the method for manufacturing the semiconductor device in the first exemplary embodiment will be described with reference to FIGS. 2A to 2D, FIGS. 3A to 3D, FIGS. 4A and 4B, FIG. 5, and FIGS. 6A to 6D. FIG. 4A is a plan view of the semiconductor device in a process, and FIG. 4B is a cross-sectional view of the semiconductor device in the process taken along line IVB-IVB in FIG. 4A.

Figure 2A:
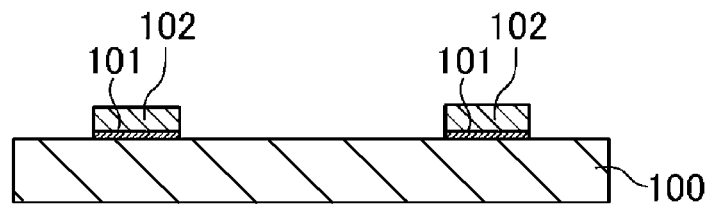
FIG. 2A is a cross-sectional view showing a method for manufacturing the semiconductor device in the first exemplary embodiment.

First, as shown in FIG. 2A, an insulating film (not shown) is formed on semiconductor substrate 100 having a semiconductor element (not shown). Subsequently, first seed layer 101 having a thickness of about 300 nm is deposited on the insulating film by a method such as a sputtering method. Then, a resist pattern (not shown) is formed on first seed layer 101, so as to have a plurality of openings each disposed at a region where first metal wiring 102 is to be formed by lithography. Subsequently, first metal wiring 102 having a thickness of about 5 μm is formed by a plating method. Then, the formed resist pattern is removed, and first seed layer 101 exposed from first metal wiring 102 is removed by wet etching. Here, first seed layer 101 can be made of titanium, and first metal wiring 102 can be made of copper. Furthermore, first seed layer 101 may be made of titanium nitride (TiN) or the like. In addition, first metal wiring 102 can be made of conductive material other than copper such as aluminum (Al), gold (Au), silver (Ag), or their alloy.

Figure 2B:
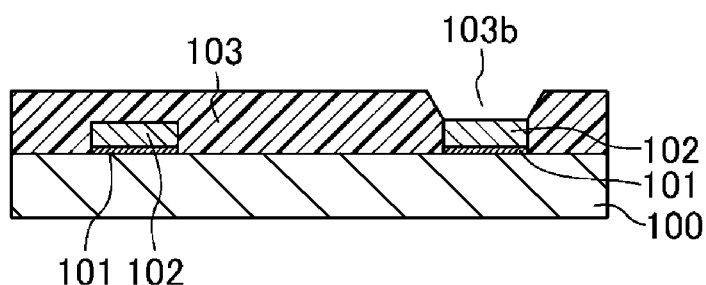
FIG. 2B is a cross-sectional view showing the method for manufacturing the semiconductor device in the first exemplary embodiment.

Subsequently, as shown in FIG. 2B, first organic insulating film 103 is applied to semiconductor substrate 100 and first metal wiring 102. For example, first organic insulating film 103 can be made of photo-sensitive siloxane resin. The photo-sensitive siloxane resin having a thickness of 12 μm is applied by a spin coating method, and subjected to post apply bake (PAB) at a temperature of 120° C. After that, i-line exposure is selectively performed with a mercury lamp. Then, the resin is developed by a paddle development method with a tetramethylammonium hydroxide (TMAH) developer having a concentration of 2.38%, thereby removing an exposed portion. Thus, opening 103b having a width of about 15 μm is provided to expose an upper surface of at least one of first metal wirings 102. After that, a curing process is performed for about 60 minutes at about 320° C. in a curing furnace to cure first organic insulating film 103. Here, the photo-sensitive organic resin may be an organic resin such as polyimide, phenol, polybenzoxazole (PBO) or BCB, instead of siloxane resin.

Figure 2C:
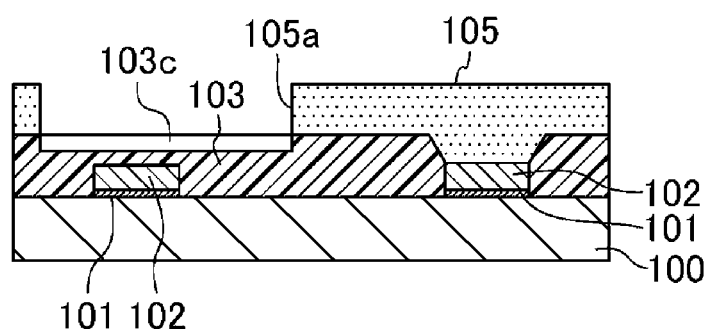
FIG. 2C is a cross-sectional view showing the method for manufacturing the semiconductor device in the first exemplary embodiment.

Subsequently, as shown in FIG. 2C, resist pattern 105 is formed by i-line exposure on first organic insulating film 103 including a region where a pad of second metal wiring is to be formed. This resist pattern has plurality of line-shaped openings 105a each having a width of about 1 μm. Here, opening 105a is formed above first metal wiring 102, but opening 105a does not need to be formed above first metal wiring 102. After that, a surface of first organic insulating film 103 which is exposed from resist pattern 105 is removed by a depth of about 1 μm by an ashing process. Thus, groove 103c having a width of about 1 μm is formed in first organic insulating film 103 exposed in opening 105a of resist pattern 105. After that, a sparse film having a lower density than first organic insulating film 103 may be filled in at least one part of groove 103c.

Figure 5:
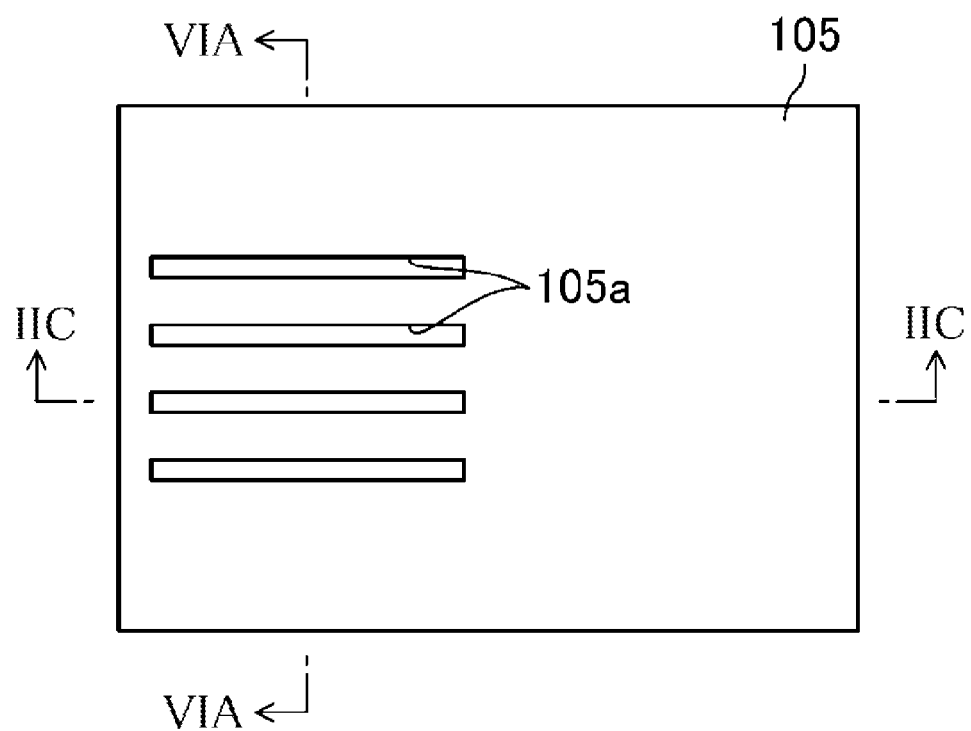
FIG. 5 is a plan view of the semiconductor device in the process shown in FIG. 2C.
Figure 6A:
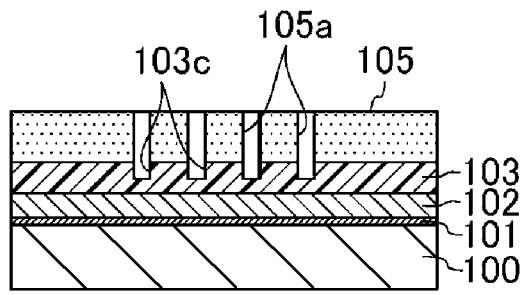
FIG. 6A is a cross-sectional view of the semiconductor device taken along line VIA-VIA in FIG. 5.
Figure 6B:
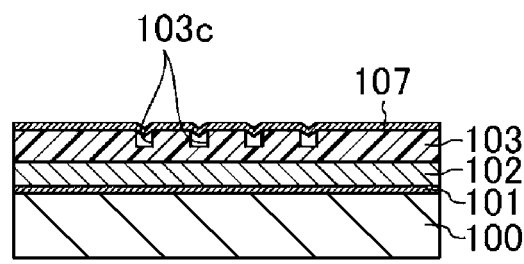
FIG. 6B is a cross-sectional view of the semiconductor device taken along a line corresponding to line VIA-VIA in FIG. 5 in the process shown in FIG. 2D.
Figure 6C:
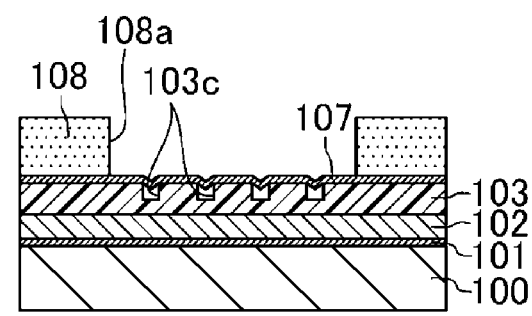
FIG. 6C is a cross-sectional view of the semiconductor device taken along a line corresponding to line VIA-VIA in FIG. 5 in the process shown in FIG. 3A.
Figure 6D:
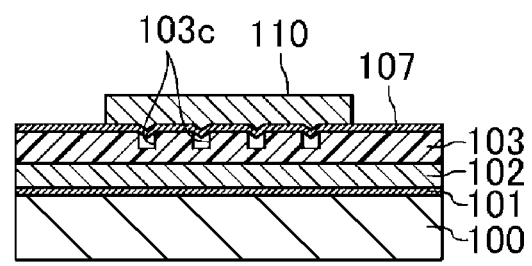
FIG. 6D is a cross-sectional view of the semiconductor device taken along a line corresponding to line VIA-VIA in FIG. 5 in the process shown in FIG. 3B.

Here, FIG. 5 shows a planar configuration of the semiconductor device after the process shown in FIG. 2C. A cross-sectional view taken along line IIC-IIC in FIG. 5 is FIG. 2C, and FIGS. 2C and 2D and FIGS. 3A to 3D are cross-sectional views taken along a line corresponding to line IIC-IIC in FIG. 5. Furthermore, a cross-sectional view taken along line VIA-VIA in FIG. 5 is FIG. 6A, and FIGS. 6B to 6D are cross-sectional views taken along a line corresponding to line VIA-VIA in FIG. 5. That is, FIGS. 6B to 6D are cross-sectional views which correspond to processes shown in FIGS. 2D, 3A, and 3B, respectively. As shown in FIGS. 2C, 5, and 6A, plurality of grooves 103c each having a width of about 1 μm are formed parallel to each other.

Figure 2D:
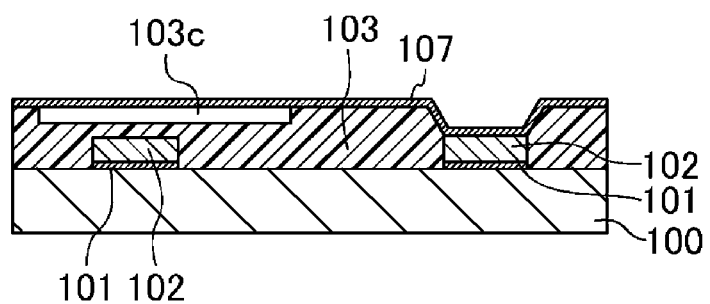
FIG. 2D is a cross-sectional view showing the method for manufacturing the semiconductor device in the first exemplary embodiment.

After resist pattern 105 is removed, as shown in FIG. 2D and FIG. 6B, second seed layer 107 made of Ti and having a thickness of 300 nm is deposited by a sputtering method. At this time, a sputtering angle is set to be tilted by about 15°. A tilt is provided in a perpendicular direction to the plane of the drawing in FIG. 2D, that is, a direction perpendicular to a longitudinal direction of groove 103c. Here, the width of groove 103c formed in opening 105a by the ashing process can be as fine as 1 μm. Therefore, when the sputtering is performed obliquely to groove 103c with a small width, second seed layer 7 is not deposited on a bottom of groove 103c. Thus, a metal wiring is not formed into groove 103c by copper plating which will be performed in later process.

Figure 3A:
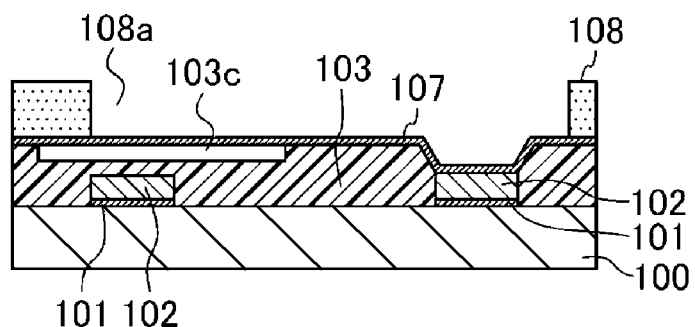
FIG. 3A is a cross-sectional view showing the method for manufacturing the semiconductor device in the first exemplary embodiment.
Figure 4A:
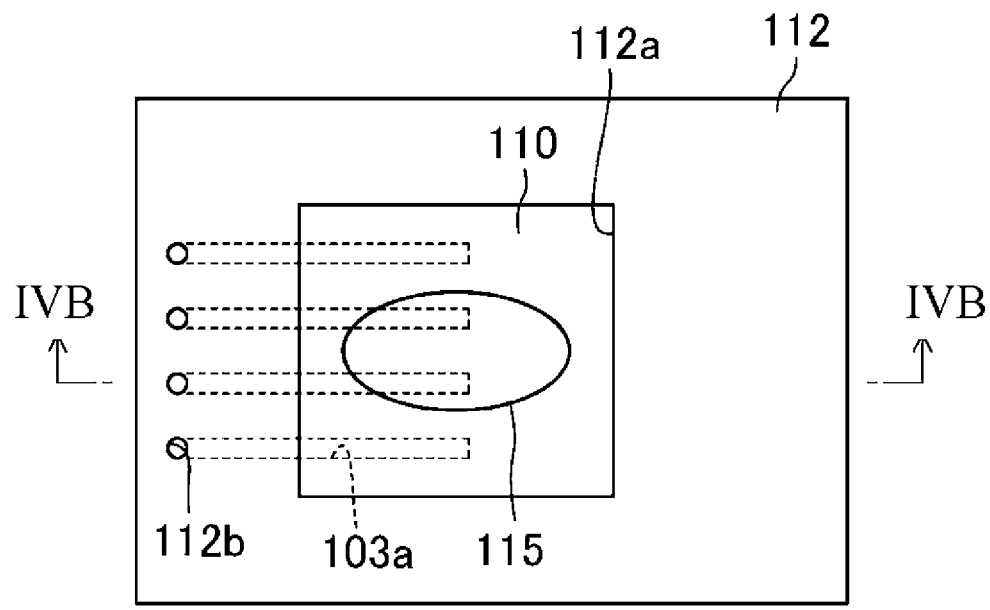
FIG. 4A is a plan view of the semiconductor device in a process in the first exemplary embodiment.
Figure 4B:
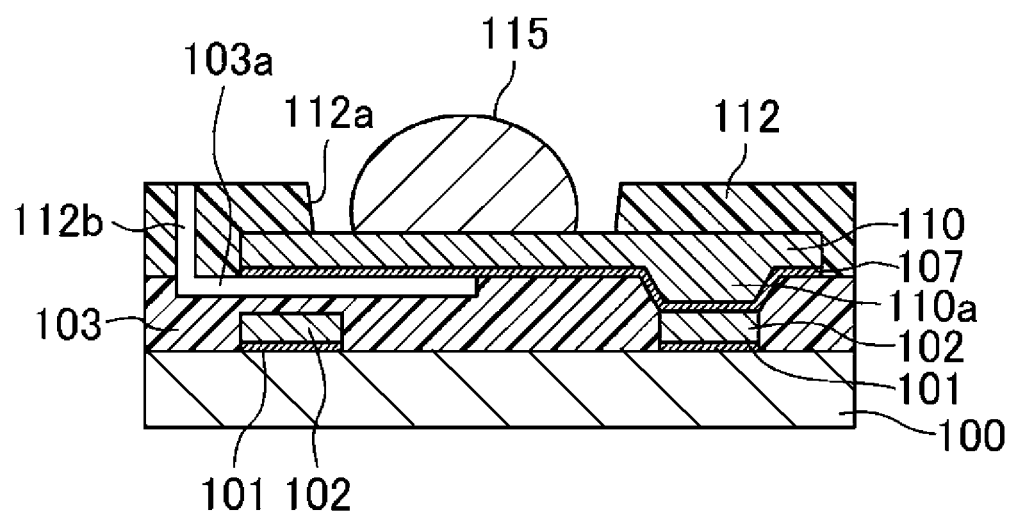
FIG. 4B is a cross-sectional view of the semiconductor device in the process taken along line IVB-IVB in FIG. 4A.

Subsequently, as shown in FIGS. 3A and 6C, resist pattern 108 having opening 108a in which second metal wiring is to be formed is formed on second seed layer 107 by a lithography method.

Figure 3B:
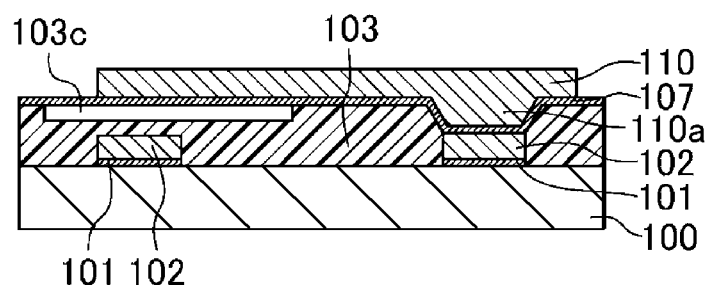
FIG. 3B is a cross-sectional view showing the method for manufacturing the semiconductor device in the first exemplary embodiment.

Subsequently, as shown in FIGS. 3B and 6D, copper is filled in opening 108a of resist pattern 108 by an electrolytic plating method, whereby second metal wiring 110 made of copper and having a thickness of about 5 μm is formed. After that, resist pattern 108 is removed.

Figure 3C:
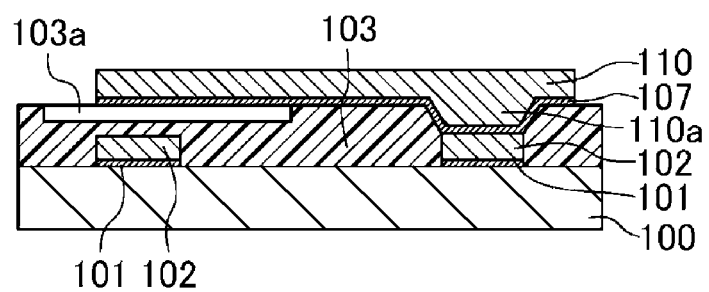
FIG. 3C is a cross-sectional view showing the method for manufacturing the semiconductor device in the first exemplary embodiment.

Subsequently, as shown in FIG. 3C, second seed layer 107 exposed from second metal wiring 110 is removed by a wet etching method using acid solution. Thus, tunnel portion 103a can be formed from groove 103c which is not filled with copper. Here, each tunnel portion 103a is the hollow portion, but a sparse film such as a porous film may be filled in tunnel portion 103a. That is, the sparse film may be formed in a part of tunnel portion 103a as long as plurality of tunnel portions 103a entirely serve as a sparser film than first organic insulating film 103. In this structure, each tunnel portion 103a can function to discharge the gas generated from first organic insulating film 103 outside the semiconductor device.

Figure 3D:
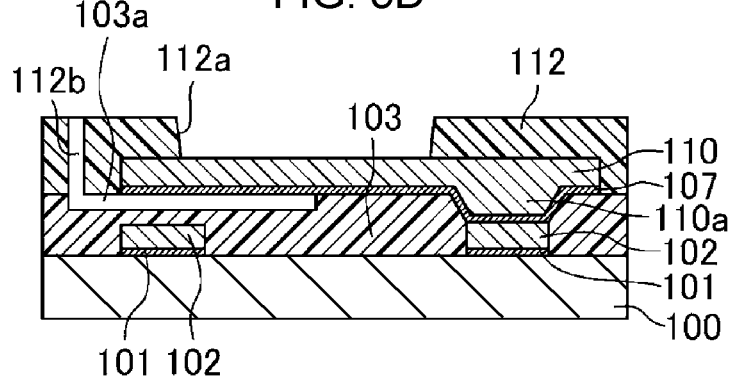
FIG. 3D is a cross-sectional view showing the method for manufacturing the semiconductor device in the first exemplary embodiment.

As shown in FIG. 3D, second organic insulating film 112 having a thickness of about 12 μm is formed on first organic insulating film 103 so as to cover second metal wiring 110, by a spin coating method. Second organic insulating film 112 is made of material such as photo-sensitive siloxane resin. After that, second organic insulating film 112 is subjected to post apply bake at a temperature of 120° C., and then, i-line exposure is selectively performed. Then, the exposed region is removed by a paddle development method with a TMAH developer having a concentration of 2.38%. Thus, opening 112a to expose second metal wiring 110 is formed, and upward tunnel portion 112b having a diameter of about 5 μm is formed to be connected to tunnel portion 103a. The exposed region of second metal wiring 110 in opening 112a serves as a region for a pad to be connected to a solder bump, and its area is about 600 μm×600 μm.

Subsequently, patterned second organic insulating film 112 is subjected to a curing process for about 60 minutes at about 320° C. so that second organic insulating film 112 is cured. Here, since second organic insulating film 112 is cured at high temperature, a low-molecular component and residual solvent in first organic insulating film 103 are vaporized and gas is generated. As shown in FIG. 3D, in the case where second metal wiring 110 is used as the connection pad to the solder bump, as described above, the area of the pad region is larger than the other metal wiring. Therefore, the gas generated from first organic insulating film 103 provided under relatively large second metal wiring 110 cannot be discharged and is accumulated under second metal wiring 110. Thus, a pressure of the accumulated gas becomes high in an interface between second metal wiring 110 and first organic insulating film 103. As a result, peeling occurs between organic film 103 under metal wiring 110, and metal wiring 110. However, according to this exemplary embodiment, plurality of tunnel portions 103a are provided in first organic insulating film 103 under second metal wiring 110, and plurality of upward tunnel portions 112b are provided in second organic insulating film 112 outside a region where second metal wiring 110 is formed. Thus, the gas generated from first organic insulating film 103 can be discharged from the region under second metal wiring 110 to the outside through tunnel portion 103a and upward tunnel portion 112b. As a result, the peeling hardly occurs between second metal wiring 110 and first organic insulating film 103, so that reliability can be ensured in the semiconductor device.

Subsequently, as shown in FIGS. 4A and 4B, solder bump 115 is formed on the exposed region in opening 112a of second organic insulating film 112. Here, in a case where the semiconductor device is an in-vehicle semiconductor device or an industrial high-voltage inverter device requiring high reliability, the solder bump is formed in a high-temperature solder process in which a heat treatment is performed for about 60 minutes at about 350° C. At this time, semiconductor substrate 100 is subjected to the temperature equal to or higher than the curing temperature of second organic insulating film 112, so that the gas is more generated from first organic insulating film 103 provided under second metal wiring 110. The gas generated in this high-temperature solder process is discharged from the upper surface of second organic insulating film 112 outside the semiconductor device through plurality of tunnel portions 103a provided under second metal wiring 110 and upward tunnel portions 112b. Thus, according to this exemplary embodiment, the peeling is prevented from occurring between first organic insulating film 103 and second metal wiring 110, so that reliability can be high in the semiconductor device.

Variation 1 of First Exemplary Embodiment

Figure 7A:
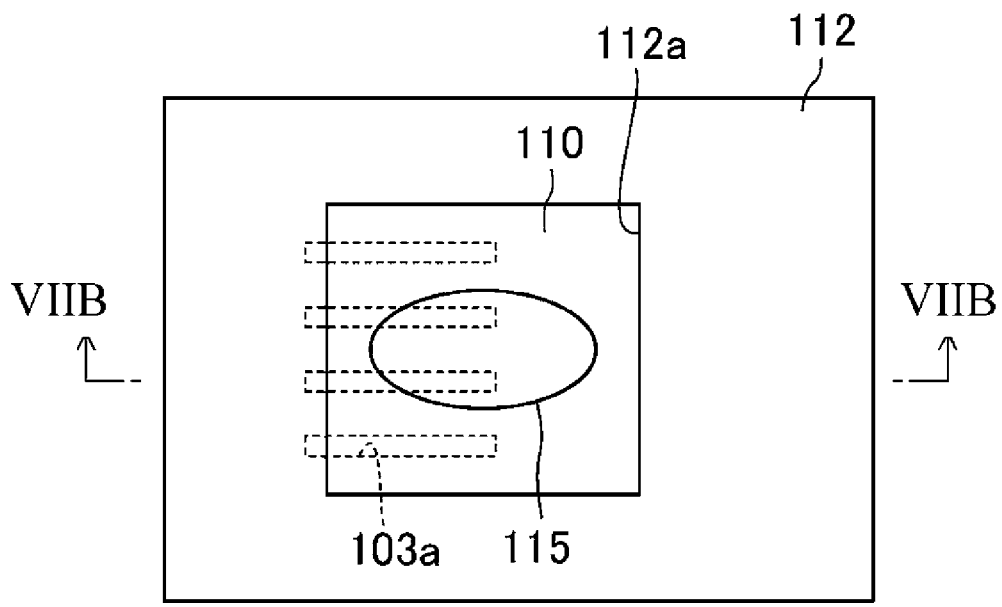
FIG. 7A is a plan view showing a main part of a semiconductor device in Variation 1 of the first exemplary embodiment.
Figure 7B:
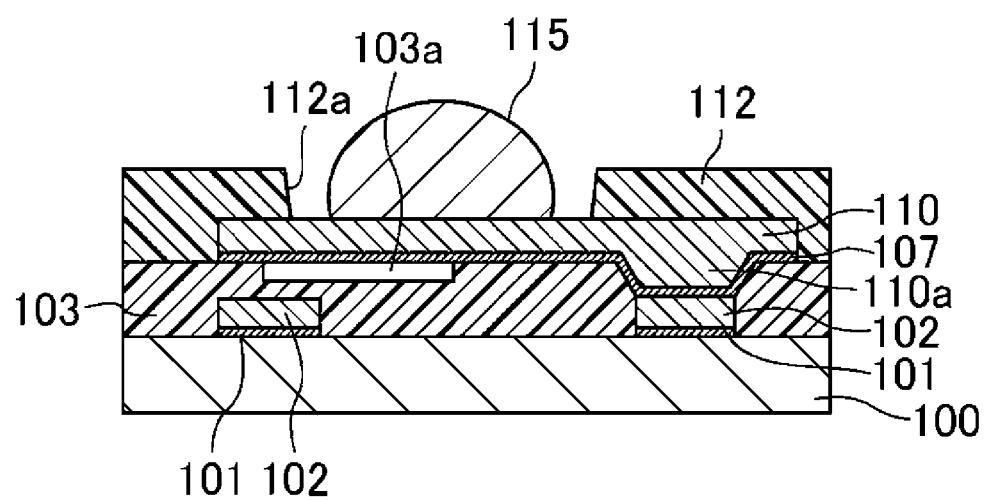
FIG. 7B is a cross-sectional view of the semiconductor device taken along line VIIB-VIIB in FIG. 7A.

FIGS. 7A and 7B each show Variation 1 of the first exemplary embodiment. FIG. 7A is a plan view of the semiconductor device, and FIG. 7B is a cross-sectional view of the semiconductor device taken along line VIIB-VIIB in FIG. 7A.

In Variation 1, the same component as in the first exemplary embodiment is marked with the same reference and its description is skipped. The same is true in a second exemplary embodiment and a third exemplary embodiment. As shown in FIG. 7B, plurality of tunnel portions 103a in the semiconductor device may be only formed in the region under second metal wiring 110. That is, both ends of each tunnel portion 103a may be provided under second metal wiring 110 in planar view. Therefore, each tunnel portion 103a may not be provided with upward tunnel portion 112b. Even in this configuration, each tunnel portion 103a is a hollow portion or filled with the film sparser than first organic insulating film 103, so that gas can be stored in each tunnel portion 103a. Furthermore, the gas generated from first organic insulating film 103 moves toward an end of second metal wiring 110 through tunnel portion 103a. The moved gas can be diffused into and pass through first organic insulating film 103 and second organic insulating film 112, so that it can be discharged outside the semiconductor device.

Thus, according to the semiconductor device in Variation 1, the gas can be temporarily stored in tunnel portion 103a. Therefore, a gas pressure does not become high in the interface between first organic insulating film 103 and second metal wiring 110 having relatively large area, so that it is possible to prevent the peeling of relatively large second metal wiring 110 formed on first organic insulating film 103.

Other Variations of Tunnel Portion

Figure 8A:
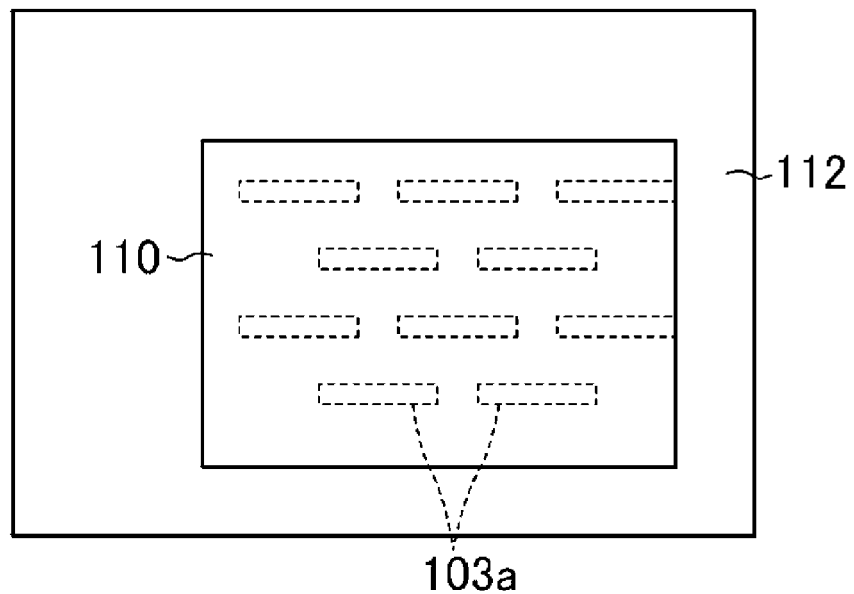
FIG. 8A is a plan view showing a variation of a tunnel portion in the semiconductor device in the first exemplary embodiment (solder bump is not shown)
Figure 8B:
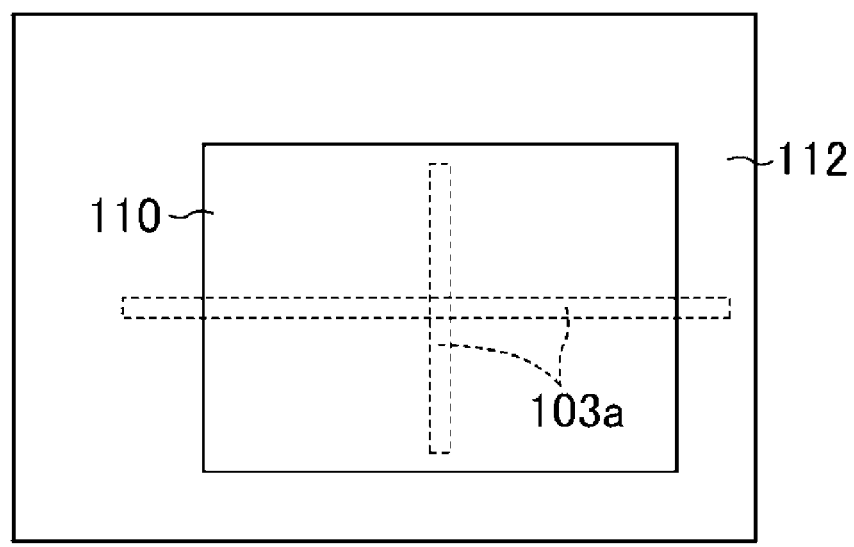
FIG. 8B is a plan view showing another variation of the tunnel portion in the semiconductor device in the first exemplary embodiment (solder bump is not shown)
Figure 8C:
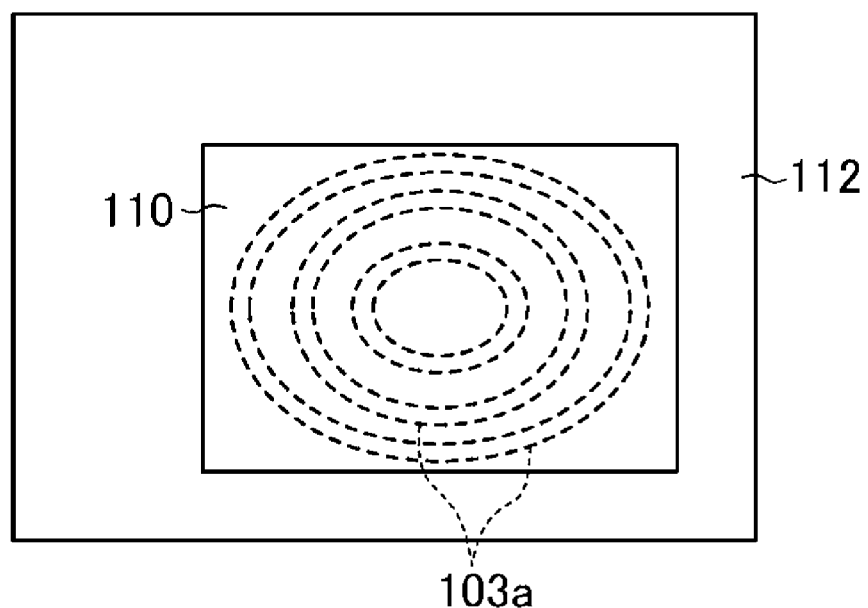
FIG. 8C is a plan view showing another variation of the tunnel portion in the semiconductor device in the first exemplary embodiment (solder bump is not shown)

FIGS. 8A to 8C are plan views showing variations of the tunnel portions formed in the semiconductor device in the first exemplary embodiment. The solder bump is omitted in FIGS. 8A to 8C.

As shown in FIGS. 8A to 8C, a planar shape of tunnel portion 103a may be any shape other than the linear stripe. The solder bump is not shown in FIGS. 8A to 8C. Furthermore, a width of each tunnel portion 103a is about 1 μm.

For example, as shown in FIG. 8A, plurality of tunnel portions 103a may be formed separately under second metal wiring 110.

Furthermore, as shown in FIG. 8B, plurality of tunnel portions 103a may intersect with each other. Furthermore, at least one of plurality of tunnel portions 103a may extend outside the region under second metal wiring 110.

In addition, as shown in FIG. 8C, tunnel portions 103a may be disposed in concentric ring shape under second metal wiring 110.

Tunnel portion 103a in each variation is filled with a sparse film having a lower density than first organic insulating film 103, or a hollow portion, and formed in contact with the lower surface of second metal wiring 110. Therefore, the gas generated from first organic insulating film 103 under a vicinity of a center portion of relatively large second metal wiring 110 can be diffused to the end of second metal wiring 110 through tunnel portions 103a. The diffused gas in the end of second metal wiring 110 is diffused in first organic insulating film 103 and second organic insulating film 112 and then discharged outside the semiconductor device. Furthermore, plurality of tunnel portions 103a should be preferably disposed so as to pass through inside a region under the relatively large second metal wiring 110 in planar view. More preferably, at least one of plurality of tunnel portions 103a is disposed so as to pass through a region under the center portion of second metal wiring 110.

Variation 2 of First Exemplary Embodiment

Figure 9A:
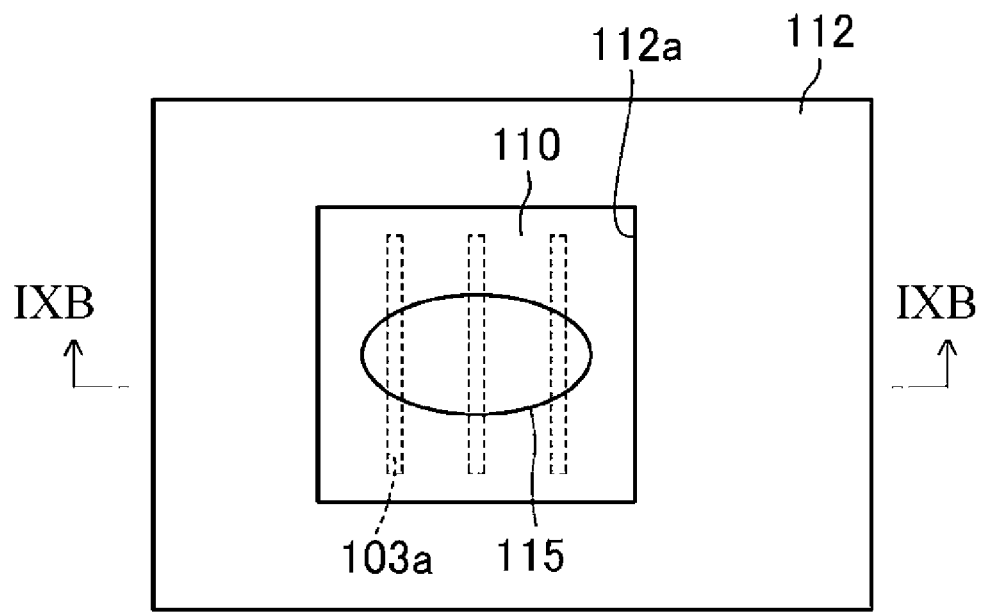
FIG. 9A is a plan view showing a main part of a semiconductor device in Variation 2 of the first exemplary embodiment.

Hereinafter, a semiconductor device in Variation 2 of the first exemplary embodiment will be described with reference to FIGS. 9A and 9B. FIG. 9A is a plan view of the semiconductor device, and FIG. 9B is a cross-sectional view of the semiconductor device taken along line IXB-IXB in FIG. 9A.

Figure 9B:
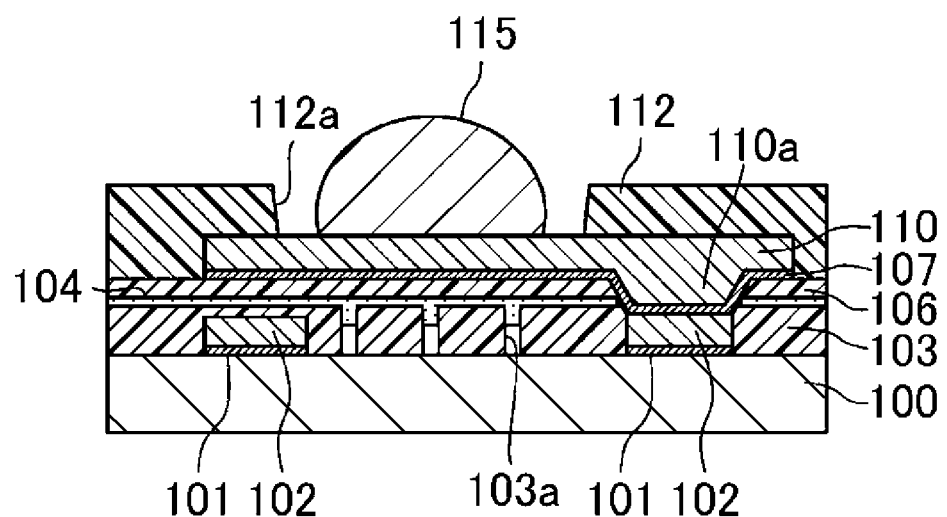
FIG. 9B is a cross-sectional view of the semiconductor device taken along line IXB-IXB in FIG. 9A.

As shown in FIGS. 9A and 9B, in the semiconductor device in Variation 2, plurality of tunnel portions 103a are provided in a region between first metal wirings 102. Furthermore, plurality of tunnel portions 103a are provided so as to penetrate first organic insulating film 103 in a direction perpendicular to a main surface of semiconductor substrate 100. Furthermore, both ends of each tunnel portion 103a are disposed inside a region under second metal wiring 110.

Furthermore, in this variation, inorganic insulating film 104 is formed so as to cover first organic insulating film 103 and plurality of tunnel portions 103a. Inorganic insulating film 104 can be made of, for example, silicon oxide ($SiO_2$) or silicon nitride (SiN). As will be described below, inorganic insulating film 104 should have a thickness so as to be able to cover an upper opening of each tunnel portion 103a.

Third organic insulating film 106 made of the same material as first organic insulating film 103 is formed on inorganic insulating film 104. Therefore, third organic insulating film 106 can be regarded as a part of first organic insulating film 103. Third organic insulating film 106 has been partially removed in a portion connecting between via 110a of second metal wiring 110 and first metal wiring 102.

Furthermore, an extending direction of plurality of tunnel portions 103a in this variation is rotated by 90° with respect to an extending direction of plurality of tunnel portions 103a shown in FIG. 1A, but it may be the same direction as that in FIG. 1A. Furthermore, plurality of tunnel portions 103a may be formed in any position under relatively large second metal wiring 110. In addition, a shape of tunnel portion 103a in planar view may be any shape shown in FIGS. 8A to 8C.

According to the semiconductor device in Variation 2, the gas generated from first organic insulating film 103 and third organic insulating film 106 positioned under relatively large second metal wiring 110 near its center portion is diffused to the end of second metal wiring 110 thorough tunnel portions 103a. As a result, the gas is diffused from the end of second metal wiring 110 into first organic insulating film 103, third organic insulating film 106, and second organic insulating film 112, and discharged outside the semiconductor device. Thus, a gas pressure does not become high in an interface between third organic insulating film 106 and second metal wiring 110, so that it is possible to prevent the peeling of relatively large second metal wiring 110 formed just above third organic insulating film 106.

Manufacturing Method

Hereinafter, a method for manufacturing the semiconductor device in Variation 2 of the first exemplary embodiment will be described with reference to FIGS. 10A to 10D and FIGS. 11A to 11C.

Figure 10A:
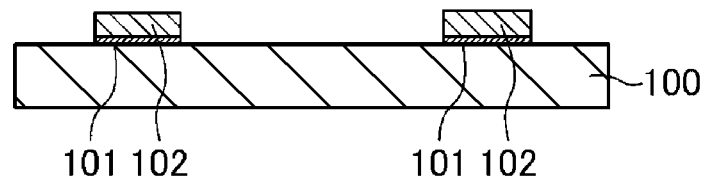
FIG. 10A is a cross-sectional view showing a method for manufacturing the semiconductor device in Variation 2 of the first exemplary embodiment.

First, as shown in FIG. 10A, an insulating film (not shown) is formed on semiconductor substrate 100 having a semiconductor element (not shown). After that, similar to the first exemplary embodiment, plurality of first seed layers 101 made of Ti, and plurality of first metal wirings 102 made of Cu are sequentially formed on the insulating film.

Figure 10B:
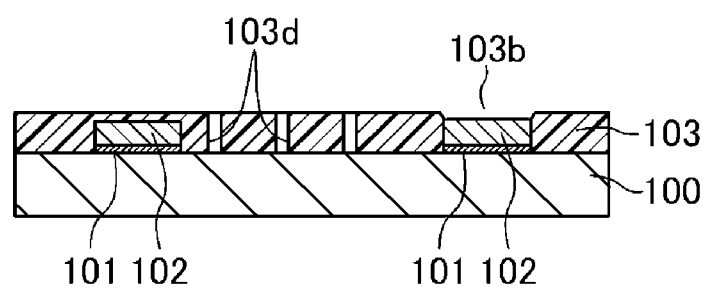
FIG. 10B is a cross-sectional view showing the method for manufacturing the semiconductor device in Variation 2 of the first exemplary embodiment.

Subsequently, as shown in FIG. 10B, first organic insulating film 103 is applied to semiconductor substrate 100 so as to cover first metal wiring 102 by a spin coating method. Then, a resist pattern (not shown) is formed by lithography to provide opening 103b to expose at least one of first metal wirings 102, and plurality of openings 103d in a region between adjacent first metal wirings 102. Subsequently, first organic insulating film 103 is etched by using the formed resist pattern as a mask. Through this etching process, opening 103b to expose at least one of first metal wirings 102, and plurality of openings 103d extending in parallel to each other in the region between adjacent first metal wirings 102 are formed in first organic insulating film 103. Here, opening 103b to expose first metal wiring 102 has a rectangular shape having a width of about 15 μm. Furthermore, each opening 103d, which is provided in the region between adjacent first metal wirings 102 in first organic insulating film 103, has a linear shape having a width of about 1 μm. After that, a curing process is performed for about 60 minutes at 320° C., whereby first organic insulating film 103 is cured.

Figure 10C:
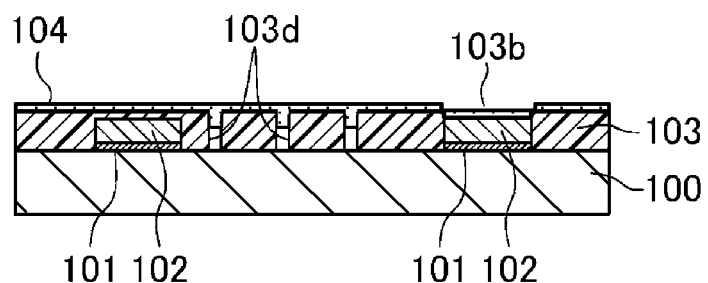
FIG. 10C is a cross-sectional view showing the method for manufacturing the semiconductor device in Variation 2 of the first exemplary embodiment.

Subsequently, as shown in FIG. 10C, inorganic insulating film 104 made of silicon oxide and having a thickness of 30 nm is deposited on first organic insulating film 103 having plurality of openings 103d, by a sputtering method. The sputtering is performed with a sputtering angle tilted by 15° with respect to a main surface of semiconductor substrate 100. At this time, a direction of the sputtering angle is perpendicular to a longitudinal direction of linear opening 103d. Thus, when the sputtering angle is tilted, a pinch-off of inorganic insulating film 104 is generated because each opening 103d has a very small opening width. That is, a top edge of opening 103d is plugged with inorganic insulating film 104, so that inorganic insulating film 104 does not reach an inside of opening 103d. Furthermore, inorganic insulating film 104 may be made of silicon nitride or the like, instead of silicon oxide.

Figure 10D:
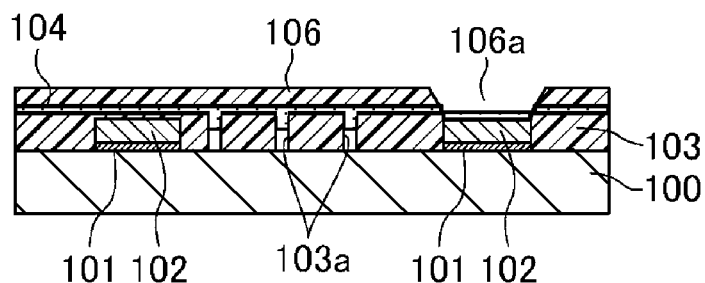
FIG. 10D is a cross-sectional view showing the method for manufacturing the semiconductor device in Variation 2 of the first exemplary embodiment.

Subsequently, as shown in FIG. 10D, third organic insulating film 106 is deposited on inorganic insulating film 104. At this time, since plurality of openings 103d of first organic insulating film 103 are plugged with inorganic insulating film 104, each opening 103d is not filled with third organic insulating film 106. Thus, tunnel portions 103a perpendicularly penetrating first organic insulating film 103 that covers first metal wiring 102 are formed in a region under relatively large second metal wiring 110. After that, by a lithography method and a developing process, opening 106a is formed in third organic insulating film 106 to provide via 110a, in a position of opening 103b of first organic insulating film 103.

Figure 11A:
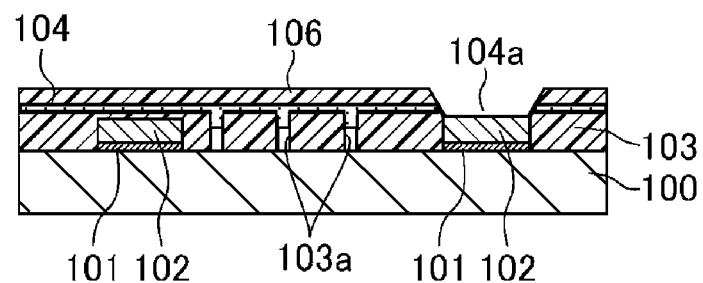
FIG. 11A is a cross-sectional view showing the method for manufacturing the semiconductor device in Variation 2 of the first exemplary embodiment.

Subsequently, as shown in FIG. 11A, inorganic insulating film 104 exposed in opening 106a is removed by an ashing process. Thus, opening 104a to expose first metal wiring 102 is formed in inorganic insulating film 104.

Figure 11B:
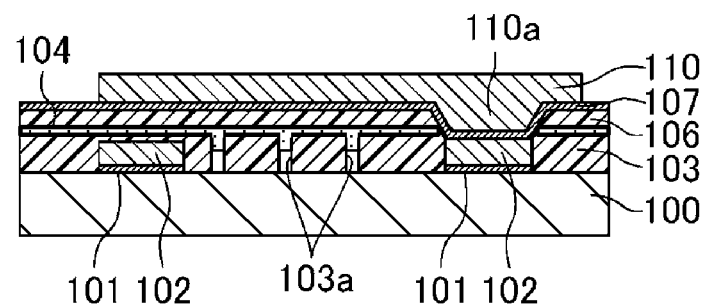
FIG. 11B is a cross-sectional view showing the method for manufacturing the semiconductor device in Variation 2 of the first exemplary embodiment.
Figure 11C:
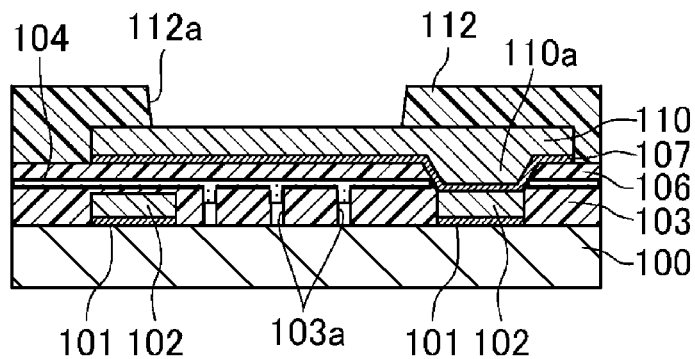
FIG. 11C is a cross-sectional view showing the method for manufacturing the semiconductor device in Variation 2 of the first exemplary embodiment.

After that, as shown in FIG. 11B, similar to the first exemplary embodiment, second seed layer 107 and second metal wiring 110 are formed, and then as shown in FIG. 11C, second organic insulating film 112 having opening 112a is formed.

Subsequently, solder bump 115 is formed on second metal wiring 110 in opening 112a of second organic insulating film 112, whereby the semiconductor device shown in FIGS. 9A and 9B are provided.

In FIG. 11C, second organic insulating film 112 is cured for about 60 minutes at about 320° C. At this time, gas is generated from first organic insulating film 103 and third organic insulating film 106. Each tunnel portion 103a is a hollow portion, or filled with a film sparser than organic insulating film. Therefore, the gas generated from organic insulating films 103 and 106 in the vicinity of a center portion of relatively large second metal wiring 110 is diffused to an end of second metal wiring 110 through tunnel portions 103a. Furthermore, the gas diffused to the end of second metal wiring 110 can be discharged from the end of second metal wiring 110 outside the semiconductor device through organic insulating films 103, 106, and 112. Thus, a gas pressure does not become high in an interface between third organic insulating film 106 and second metal wiring 110, so that it is possible to prevent the peeling of relatively large second metal wiring 110 formed just above third organic insulating film 106.

Second Exemplary Embodiment

Hereinafter, a semiconductor device having a tunnel portion in a metal wiring, and a method for manufacturing the same in the second exemplary embodiment will be described with reference to the drawings.

Figure 12A:
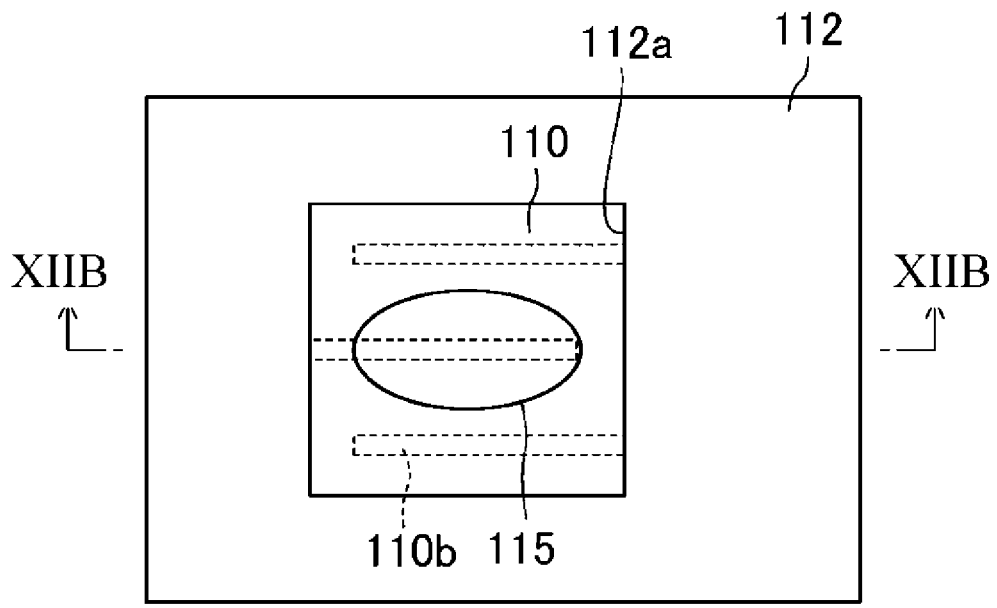
FIG. 12A is a plan view showing a main part of a semiconductor device in a second exemplary embodiment.
Figure 12B:
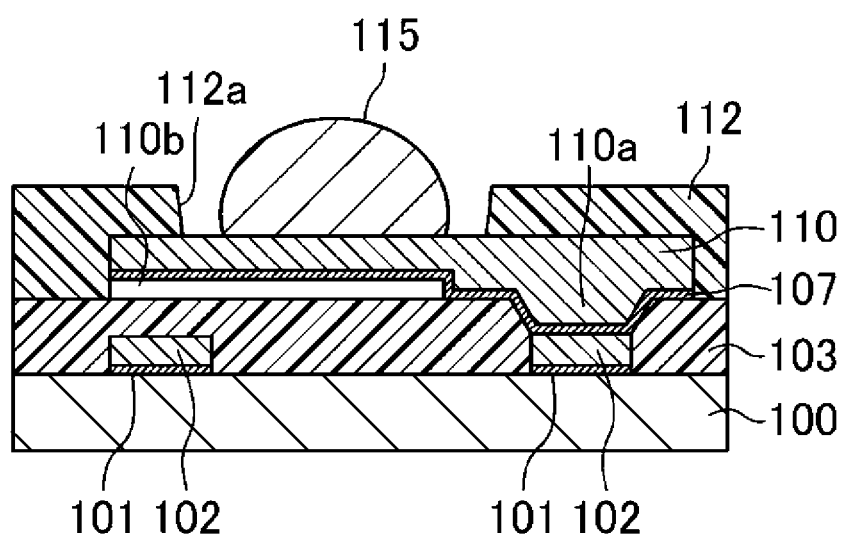
FIG. 12B is a cross-sectional view of the semiconductor device taken along line XIIB-XIIB in FIG. 12A.

FIGS. 12A and 12B each show a main part of the semiconductor device in the second exemplary embodiment. FIG. 12A is a plan view of the semiconductor device, and FIG. 12B is a cross-sectional view of the semiconductor device taken along line XIIB-XIIB in FIG. 12A.

As shown in FIGS. 12A and 12B, the semiconductor device in the second exemplary embodiment differs from the semiconductor device in the first exemplary embodiment in that tunnel portions 110b in the second exemplary embodiment are provided between first organic insulating film 103 and second metal wiring 110. More specifically, tunnel portion 110b is provided in a lower portion of second metal wiring 110 as a recess of second metal wiring 110. Plurality of tunnel portions 110b linearly extend in parallel to each other.

Furthermore, one end of tunnel portion 110b is positioned inside second metal wiring 110, and the other end thereof is disposed so as to match with an end (side) of second metal wiring 110 in planar view. That is, the other end (opening end) of tunnel portion 110b is not positioned inside second metal wiring 110, but is provided so as to face second organic insulating film 112.

As described above, both ends of tunnel portion 110 do not need to position so as to match with the corresponding sides of second metal wiring 110. That is, at least one of the both ends of tunnel portion 110b may be positioned so as to match with either side of second metal wiring 110. Furthermore, as shown in FIG. 12A, the opening ends of plurality of tunnel portions 110b may be alternately positioned on the sides of second metal wiring 110.

According to the semiconductor device in the second exemplary embodiment, gas generated in a process from first organic insulating film 103 provided under relatively large second metal wiring 110 is diffused toward each end of second metal wiring 110 through tunnel portions 110b. That is, the gas is diffused from each end of second metal wiring 110 into first organic insulating film 103 and discharged outside the semiconductor device. Therefore, a gas pressure does not become high in an interface between first organic insulating film 103 and second metal wiring 110, so that it is possible to prevent the peeling of relatively large second metal wiring 110 formed just above first organic insulating film 103.

Manufacturing Method

Hereinafter, the method for manufacturing the semiconductor device in the second exemplary embodiment will be descried with reference to FIGS. 13A to 13D.

Figure 13A:
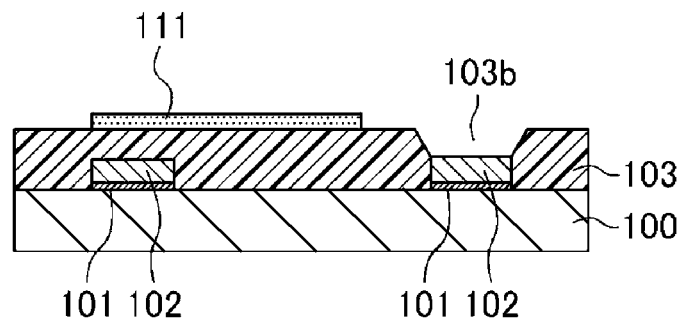
FIG. 13A is a cross-sectional view showing a method for manufacturing the semiconductor device in the second exemplary embodiment.

First, as shown in FIG. 13A, an insulating film (not shown) is formed on semiconductor substrate 100 having a semiconductor element (not shown). After that, similar to the first exemplary embodiment, plurality of first seed layers 101 made of Ti, and plurality of first metal wirings 102 made of Cu are sequentially formed on the insulating film. Subsequently, first organic insulating film 103 is applied to semiconductor substrate 100 so as to cover first metal wirings 102 by a spin coating method. Then, a resist pattern (not shown) is formed by lithography to provide opening 103b to expose at least one of first metal wirings 102. After the resist pattern is cured, first organic insulating film 103 is etched by using the formed resist pattern as a mask to provide at least one opening 103b in first organic insulating film 103. After that, the resist pattern is removed.

Subsequently, plurality of linearly extending sacrifice films 111 made of oxide silicon are formed on first organic insulating film 103 except for the region of opening 103b, that is, in a formation region of second metal wiring 110. More specifically, a silicon oxide film is formed on a whole upper surface of first organic insulating film 103 by a sputtering method. Then, the silicon oxide film is formed into sacrifice films 111 having a pattern in a region where a tunnel portion is to be formed by known lithography and etching. Here, a thickness of sacrifice film 111 is about 100 nm. Furthermore, sacrifice film 111 may be an insulating film made of nitride silicon or the like, instead of oxide silicon.

Figure 13B:
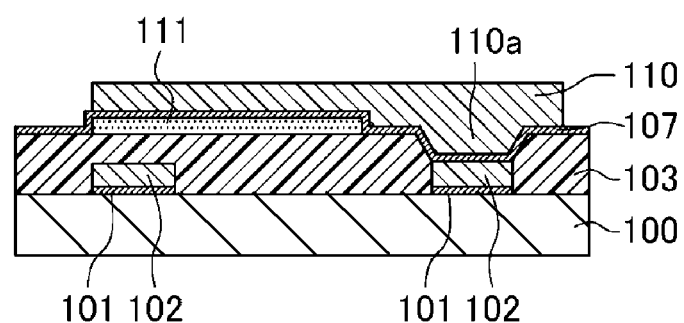
FIG. 13B is a cross-sectional view showing the method for manufacturing the semiconductor device in the second exemplary embodiment.

Subsequently, as shown in FIG. 13B, second seed layer 107 made of Ti is deposited on first organic insulating film 103 including sacrifice films 111. Then, a resist pattern (not shown) having an opening in a region where second metal wiring is to be formed is formed on deposited second seed layer 107 by a lithography method. After that, second metal wiring 110 made of Cu is formed by a plating method using the resist pattern as a mask. After that, the unnecessary resist pattern is removed by an ashing process or the like. In addition, second seed layer 107 remaining in a region other than second metal wiring 110 is removed.

Figure 13C:
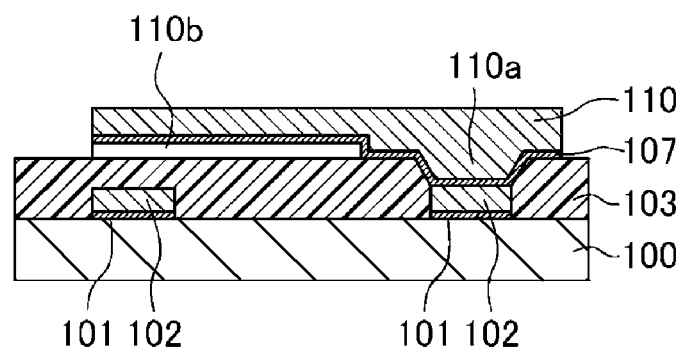
FIG. 13C is a cross-sectional view showing the method for manufacturing the semiconductor device in the second exemplary embodiment.

Subsequently, as shown in FIG. 13C, sacrifice films 111 formed between first organic insulating film 103 and second metal wiring 110 are removed by a wet etching method. Thus, a plurality of recesses which serve as tunnel portions 110b are formed in the lower portion of second metal wiring 110. Here, sacrifice films 111 made of oxide silicon is removed with an aqueous hydrofluoric (HF) acid solution having a concentration of about 0.06%. At this time, second seed layer 107 existing between second metal wiring 110 and tunnel portion 110b is not removed and remains under second metal wiring 110.

Figure 13D:
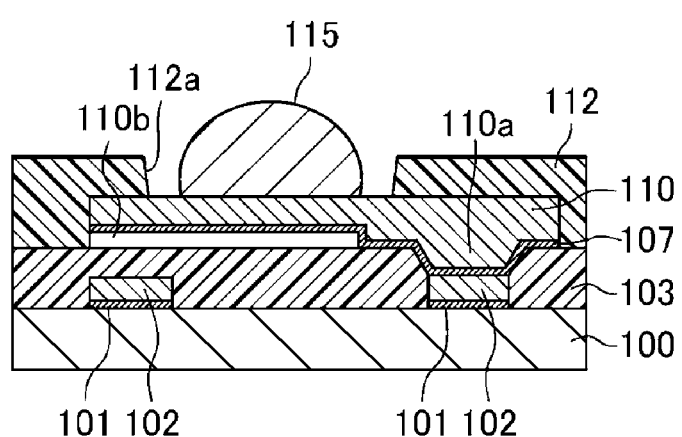
FIG. 13D is a cross-sectional view showing the method for manufacturing the semiconductor device in the second exemplary embodiment.

Subsequently, as shown in FIG. 13D, second organic insulating film 112 is deposited on first organic insulating film 103 and second metal wiring 110 by a spin coating method. Then, opening 112a is formed to expose a region where a pad of second metal wiring 110 is to be formed by a lithography method. After that, second organic insulating film 112 is cured. Then, solder bump 115 is formed on second metal wiring 110 exposed in opening 112a of second organic insulating film 112.

According to this manufacturing method, when second organic insulating film 112 is cured and when solder bump 115 is formed, gas is generated from first organic insulating film 103 and second organic insulating film 112 due to the heat applied to the semiconductor device. The gas generated from organic insulating films 103 and 112 are discharged outside through tunnel portions 110b. Therefore, second metal wiring 110 can be prevented from being peeled from first organic insulating film 103 due to the gas generated from first organic insulating film 103 positioned under second metal wiring 110.

Variation of Second Exemplary Embodiment

Figure 14A:
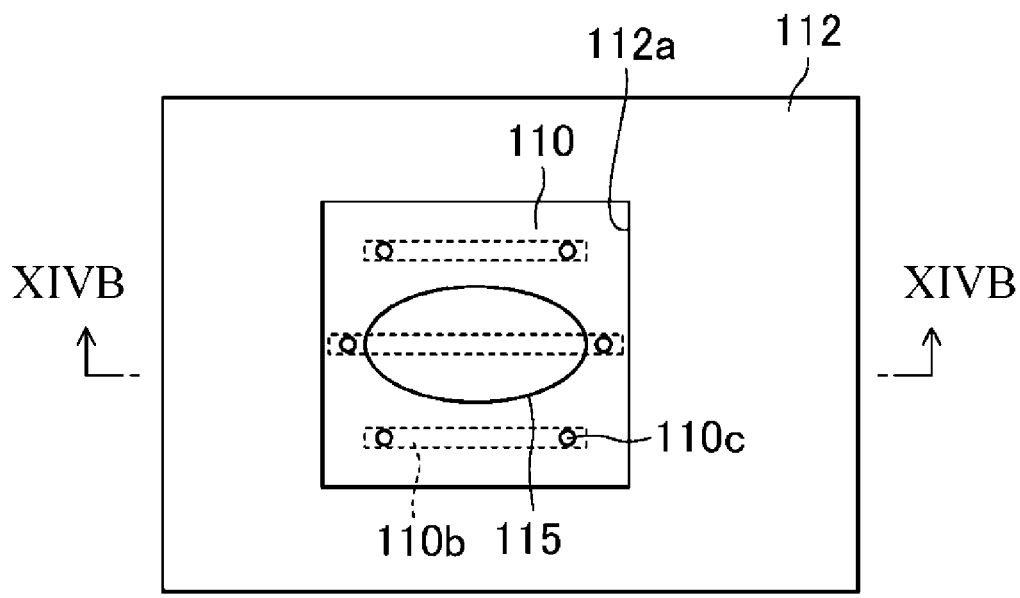
FIG. 14A is a plan view showing a main part of a semiconductor device in one variation of the second exemplary embodiment.

Hereinafter, a semiconductor device in one variation of the second exemplary embodiment will be described with reference to FIGS. 14A and 14B. FIG. 14A is a plan view of the semiconductor device, and FIG. 14B is a cross-sectional view of the semiconductor device taken along line XIVB-XIVB in FIG. 14A.

Figure 14B:
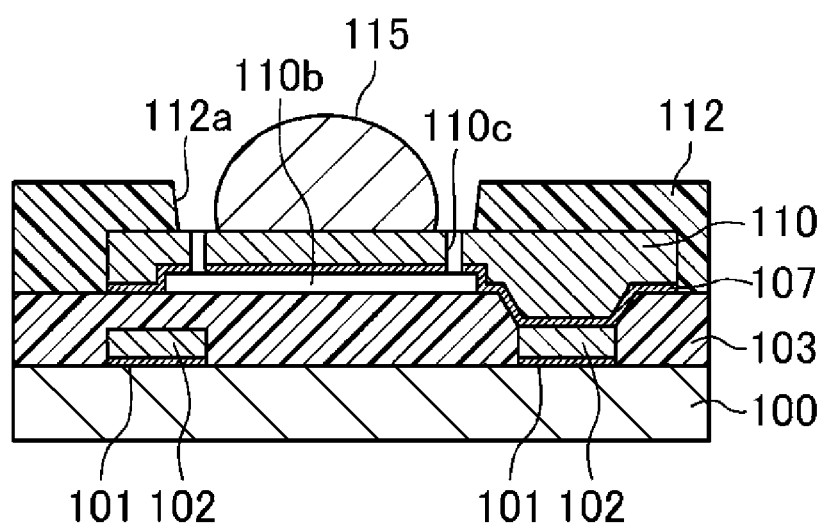
FIG. 14B is a cross-sectional view of the semiconductor device taken along line XIVB-XIVB in FIG. 14A.

As shown in FIGS. 14A and 14B, tunnel portion 110b in the semiconductor device in this variation is disposed so that its each end is positioned inside second metal wiring 110 in planar view. In the case of the semiconductor device in the second exemplary embodiment, when sacrifice film 111 is removed by wet etching, sacrifice film 111 needs to be exposed from a side of second metal wiring 110.

Meanwhile, according to this variation in which sacrifice film 111 is not exposed from the side of second metal wiring 110, a pinhole is formed from an upper surface of second metal wiring 110 to reach sacrifice film 111, so that sacrifice film 111 is exposed from the pinhole. The pinhole can be formed by a laser method or lithography method. Thus, by exposing sacrifice film 111 from the pinhole provided in second metal wiring 110, sacrifice film 111 can be removed by wet etching. In addition, the pinhole serves as upward tunnel portion 110c perpendicularly connected to tunnel portion 110.

Third Exemplary Embodiment

Hereinafter, a semiconductor device having a tunnel portion in a metal wiring and a method for manufacturing the same in the third exemplary embodiment will be described with reference to the drawings.

Figure 15:
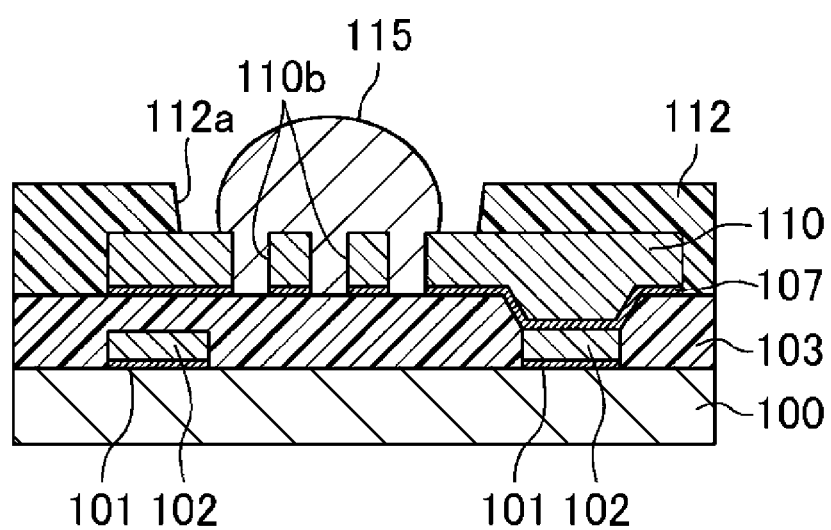
FIG. 15 is a cross-sectional view showing an essential part of a semiconductor device in a third exemplary embodiment.

FIG. 15 schematically shows a main part of the semiconductor device in the third exemplary embodiment.

As shown in FIG. 15, the semiconductor device in the third exemplary embodiment differs from the semiconductor device in the second exemplary embodiment in shape and position of tunnel portion 110b. That is, plurality of tunnel portions 110b in this exemplary embodiment penetrate second metal wiring 110 in a perpendicular direction (direction perpendicular to the main surface of semiconductor substrate 100).

Furthermore, plurality of tunnel portions 110b provided in second metal wiring 110 overlap with solder bump 115 in planar view, and each tunnel portion 110b is filled with a material of solder bump 115. As will be described below, through tunnel portions 110b in this exemplary embodiment, gas generated from first organic insulating film 103 can be discharged outside in a process before a process for manufacturing the solder bump.

Manufacturing Method

Hereinafter, the method for manufacturing the semiconductor device in the third exemplary embodiment will be described with reference to FIGS. 16A to 16D.

Figure 16A:
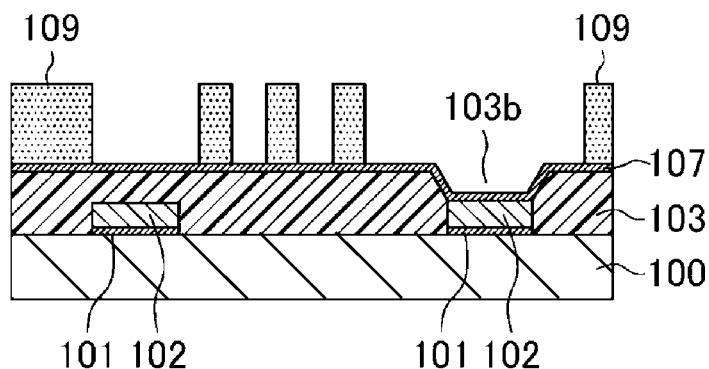
FIG. 16A is a cross-sectional view showing a method for manufacturing the semiconductor device in the third exemplary embodiment.

First, as shown in FIG. 16A, an insulating film (not shown) is formed on semiconductor substrate 100 having a semiconductor element (not shown). After that, similar to the first exemplary embodiment, plurality of first seed layers 101 made of Ti, and plurality of first metal wirings 102 made of Cu are sequentially formed on the insulating film. Subsequently, first organic insulating film 103 is applied to semiconductor substrate 100 so as to cover first metal wirings 102 by s spin coating method. Then, a resist pattern (not shown) is formed by lithography to provide opening 103b to expose at least one of first metal wirings 102. After the resist pattern is cured, first organic insulating film 103 is etched by using the formed resist pattern as a mask to provide at least one opening 103b in first organic insulating film 103. After that, the resist pattern is removed. Subsequently, second seed layer 107 made of Ti and having a thickness of about 30 nm is deposited on first organic insulating film 103. Then, resist pattern 109 having a thickness of about 7 μm is formed on second seed layer 107 by a lithography method. Here, resist pattern 109 includes an opening pattern for a region where second metal wiring 110 is to be formed and a dot pattern for forming plurality of tunnel portions 110b, the dot pattern being provided inside the opening pattern for a region where a bump is to be formed.

Figure 16B:
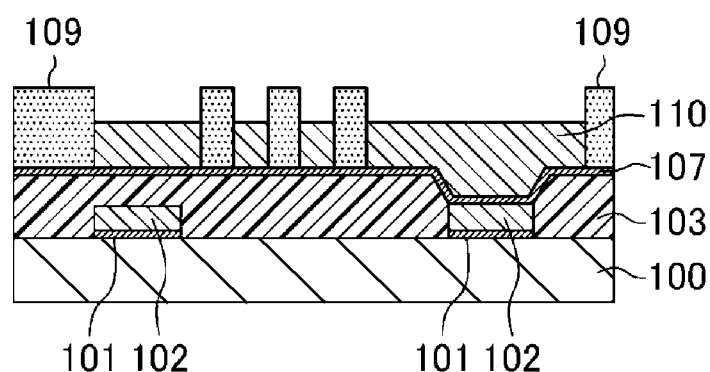
FIG. 16B is a cross-sectional view showing the method for manufacturing the semiconductor device in the third exemplary embodiment.

Subsequently, as show in FIG. 16B, Cu plating is performed by using resist pattern 109 as a mask, whereby second metal wiring 110 made of Cu is formed.

Figure 16C:
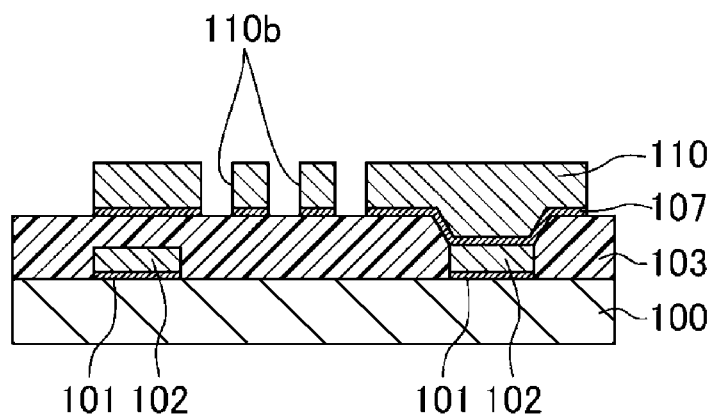
FIG. 16C is a cross-sectional view showing the method for manufacturing the semiconductor device in the third exemplary embodiment.

Subsequently, as shown in FIG. 16C, unnecessary resist pattern 109 is removed, and then second seed layer 107 exposed from second metal wiring 110 on first organic insulating film 103 is removed. Thus, plurality of tunnel portions 110b which penetrate second metal wiring 110 in the perpendicular direction are formed in second metal wiring 110 where the bump is to be formed. A diameter of each tunnel portion 110b is about 3 μm.

In this exemplary embodiment, tunnel portions 110b are formed at the same time as second metal wiring 110 by the plating method, but the present disclosure is not limited to this. For example, after second metal wiring 110 is formed, tunnel portions 110b may be formed by etching second metal wiring 110 with laser. Alternatively, after second metal wiring 110 is formed, tunnel portions 110b may be formed by a standard lithography method, and dry etching or wet etching method.

Figure 16D:
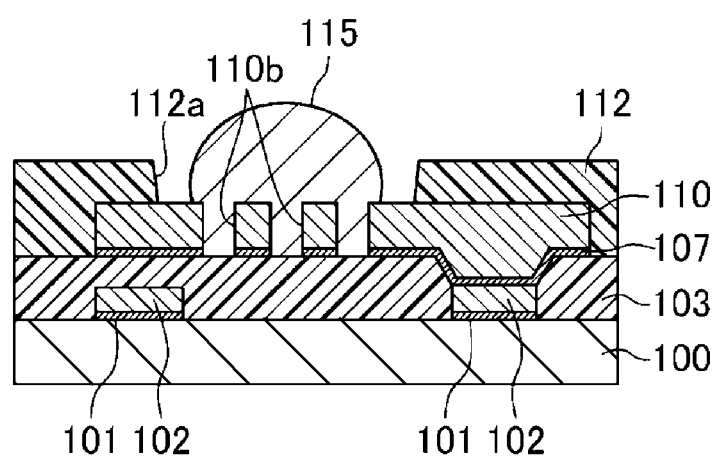
FIG. 16D is a cross-sectional view showing the method for manufacturing the semiconductor device in the third exemplary embodiment.
Figure 17:
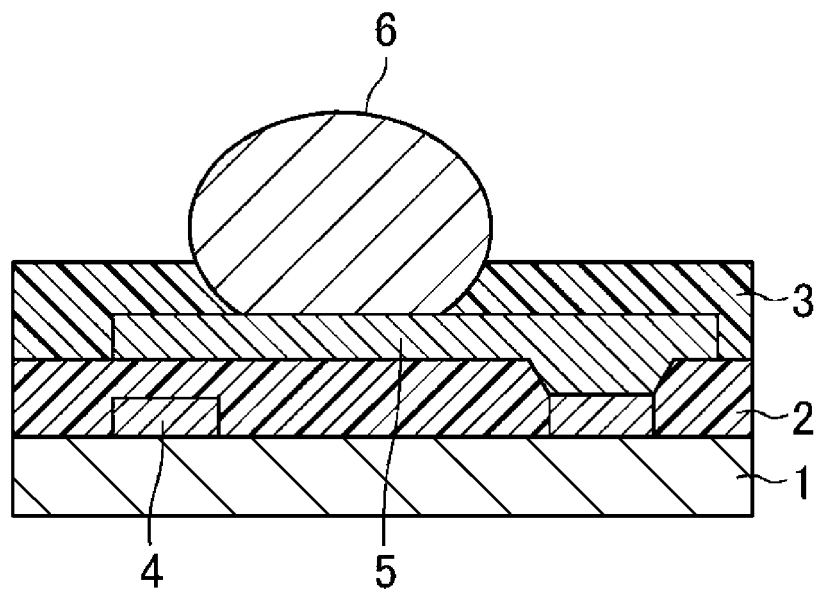
FIG. 17 is a plan view showing a main part of a semiconductor device in a first conventional example.
Figure 18:
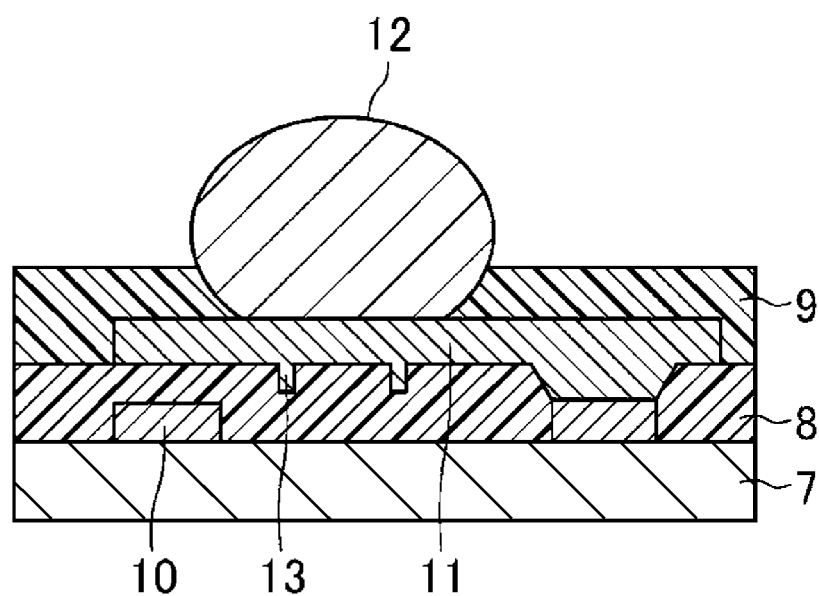
FIG. 18 is a plan view showing a main part of a semiconductor device in a second conventional example.

Subsequently, as shown in FIG. 16D, second organic insulating film 112 is formed on first organic insulating film 103 so as to cover second metal wiring 110. Then, opening 112a is formed in a region where a pad of second organic insulating film 112 is to be formed. After that, second organic insulating film 112 is cured. Then, solder bump 115 is formed on the pad of second metal wiring 110. At this time, tunnel portions 110b are filled with the material of solder bump 115. However, tunnel portions 110b does not need to be filled with the material of solder bump 115.

In the configuration of the third exemplary embodiment, even when gas is generated from first organic insulating film 103 in a heating process after solder bump 115 is formed, the generated gas cannot be discharged because each tunnel portion 110b for serving as a path for discharging the generated gas is filled with the material of solder bump 115. However, in a curing process for second organic insulating film 112 before solder bump 115 is formed, tunnel portions 110b formed in second metal wiring 110 are not filled with the material of solder bump 115. Thus, gas generated from first organic insulating film 103 can be discharged from tunnel portions 110b.

Specifically, by setting a curing temperature of second organic insulating film 112 higher than a temperature for forming solder bump 115, the gas generated from first organic insulating film 103 in the curing process of second organic insulating film 112 can be previously discharged through tunnel portions 110b. Thus, second metal wiring 110 can be prevented from being peeled from first organic insulating film 103 when solder bump 115 is formed.

Furthermore, according to a usual process for forming the solder bump, the solder bumps are sequentially adhered to the semiconductor substrate by heat. In this case, it may take 60 minutes or more until all solder bumps are adhered to the semiconductor substrate. During this process, the organic insulating film is subjected to a high temperature such as 350° C.

Therefore, according to this exemplary embodiment, even when almost all of plurality of tunnel portions 110b are filled after solder bump 115 is formed, it is possible to previously externally discharge the gas generated from first organic insulating film 103 when second organic insulating film 112 is cured. Therefore, relatively large second metal wiring 110 can be prevented from being peeled from first organic insulating film 103.

Furthermore, tunnel portion 110b provided in second metal wiring 110 needs to have an opening end in first organic insulating film 103 so that the gas generated from first organic insulating film 103 can pass through tunnel portion 110b. Furthermore, tunnel portion 110b has a hole shape in planar view in the above, but it may have any shape.

As described above, in the first exemplary embodiment and its variation, the tunnel portions are provided in the organic insulating film, while in the second exemplary embodiment, its variation, and the third exemplary embodiment, the tunnel portions are provided in the metal wiring; however, the tunnel portions should be provided at least in the organic insulating film and the metal wiring. The tunnel portions in the present disclosure are hollow, or filled with the sparse film having lower density than the organic insulating film, and the gas generated from the organic insulating film is discharged outside through the tunnel portions. Therefore, the metal wiring can be prevented from being peeled from the organic insulating film.

In general, when the organic insulating film made of polyimide, BCB, siloxane, phenol, or PBO is subjected to the curing temperature or more, a low-molecular component and a cross-linking agent are partially vaporized. The gas generated from the organic insulating film cannot pass through the high-density metal film provided over the organic insulating film. Thus, a gas pressure becomes high between the metal film and the organic insulating film, so that the metal film is peeled from the organic film.

As described above, according to the present disclosure, since the tunnel portions are formed in the interface between the metal wiring and the organic insulating film, the gas generated from the organic insulating film can be discharged through the tunnel portions, so that the present disclosure is useful for the semiconductor device including the organic insulating film and being subjected to high temperature.

The present disclosure can improve reliability of the semiconductor device having the organic insulating film subjected to high temperature during a process, and is useful for an in-vehicle semiconductor device requiring high reliability, or a high-voltage semiconductor device such as inverter device.

What is claimed is:

1. A semiconductor device comprising:
   a semiconductor substrate;
   a first wiring formed on the semiconductor substrate;
   a first organic insulating film formed to cover the first wiring;
   a second wiring formed on the first organic insulating film and having a connection portion connected to the first wiring;
   a second organic insulating film formed on the first organic insulating film to cover the second wiring and having an opening to expose the second wiring;
   a bump formed on an exposed portion of the second wring in the opening; and
   a tunnel portion formed in contact with the second wiring or the first organic insulating film, wherein
   the tunnel portion overlaps with the second wiring in planar view.

2. The semiconductor device according to claim 1, wherein the tunnel portion is a hollow portion or the hollow portion partially filled with an insulating film having a lower density than the first organic insulating film.

3. The semiconductor device according to claim 1, wherein the tunnel portion is configured from a plurality of line-shaped portions.

4. The semiconductor device according to claim 1, wherein the tunnel portion is provided in an upper portion of the first organic insulating film and disposed in contact with the second wiring.

5. The semiconductor device according to claim 1, wherein
   the tunnel portion has a first end and a second end different from the first end, and
   the first end of the tunnel portion is disposed under the second wiring.

6. The semiconductor device according to claim 5, wherein the second end of the tunnel portion is disposed in a region outside the second wiring in planar view.

7. The semiconductor device according to claim 6, further comprising an upward tunnel portion formed in the second organic insulating film, the upward tunnel portion being connected to the second end of the tunnel portion, and extending upward from the tunnel portion.

8. The semiconductor device according to claim 1, wherein the tunnel portion is provided under the second wiring and disposed in contact with the first organic insulating film.

9. The semiconductor device according to claim 8, wherein the tunnel portion is provided in a lower portion of the first organic insulating film, and a top edge of the tunnel portion is covered with an inorganic insulating film.

10. The semiconductor device according to claim 8, wherein one end of the tunnel portion is provided so as to match with an end of the second wiring in planar view.

11. The semiconductor device according to claim 8, wherein the tunnel portion has both ends positioned inside the second wiring in planar view.

12. The semiconductor device according to claim 10, wherein the tunnel portion is configured from a recess provided in a lower portion of the second wiring.

13. The semiconductor device according to claim 11, further comprising an upward tunnel portion penetrating the second wiring, the upward tunnel portion being connected to the tunnel portion, and extending upward from the tunnel portion.

14. The semiconductor device according to claim 8, wherein the tunnel portion is configured from a plurality of line-shaped portions disposed in parallel.

15. The semiconductor device according to claim 1, wherein a width Wm of the second wiring satisfies a formula below:

$$Wm > 2 \times (a_{metal}/a_{poly}) \times To$$

in which $a_{metal}$ represents specific gravity of a metal of the second wiring, $a_{poly}$ represents specific gravity of the first organic insulating film, and To represents a thickness of the first organic insulating film.

16. The semiconductor device according to claim 11, wherein the tunnel portion is configured from a recess provided in a lower portion of the second wiring.

\* \* \* \* \*